United States Patent
Nanataki et al.

(10) Patent No.: US 7,901,729 B2
(45) Date of Patent: Mar. 8, 2011

(54) METHOD OF MANUFACTURING A PIEZOELECTRIC/ELECTROSTRICTIVE DEVICE

(75) Inventors: Tsutomu Nanataki, Toyoake (JP); Hirofumi Yamaguchi, Komaki (JP); Toshikatsu Kashiwaya, Inazawa (JP); Yuya Kikuta, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 402 days.

(21) Appl. No.: 12/047,501

(22) Filed: Mar. 13, 2008

(65) Prior Publication Data

US 2008/0160179 A1 Jul. 3, 2008

Related U.S. Application Data

(62) Division of application No. 11/321,281, filed on Dec. 29, 2005, now Pat. No. 7,425,790.

(30) Foreign Application Priority Data

Jan. 11, 2005 (JP) ............................. 2005-004436

(51) Int. Cl.
  *B05D 5/12* (2006.01)
  *H01L 41/22* (2006.01)
(52) U.S. Cl. ..................... 427/100; 29/25.35
(58) Field of Classification Search ................. 427/100; 29/25.35
  See application file for complete search history.

(56) References Cited

U.S. PATENT DOCUMENTS

| | | |
|---|---|---|
| 3,268,453 A * | 8/1966 | Ouchi et al. .......... 252/62.9 PZ |
| 5,410,209 A | 4/1995 | Yamashita et al. |
| 6,093,338 A | 7/2000 | Tani et al. |
| 6,355,185 B1 | 3/2002 | Kubota |
| 6,979,410 B2 | 12/2005 | Sasaki |
| 7,056,443 B2 | 6/2006 | Sasaki et al. |
| 7,166,954 B2 | 1/2007 | Miyazawa et al. |
| 7,176,155 B2 | 2/2007 | Kashiwaya et al. |
| 2002/0056827 A1 | 5/2002 | Kashiwaya |

(Continued)

FOREIGN PATENT DOCUMENTS

EP 1482571 12/2004

(Continued)

OTHER PUBLICATIONS

Takashi Hayashi et al., "Low Temperature Sintering of PZT Powders Coated with $Pb_5Ge_3O_{11}$ by Sol-Gel Method", Journal of the European Ceramic Society 19 (1999) pp. 999-1002.

(Continued)

*Primary Examiner*—Brian K Talbot
(74) *Attorney, Agent, or Firm*—Burr & Brown

(57) ABSTRACT

There is disclosed a piezoelectric/electrostrictive porcelain composition capable of manufacturing, at a comparatively low sintering temperature, a piezoelectric/electrostrictive body which is dense and superior in crystallinity and which has satisfactory piezoelectric/electrostrictive characteristics so that deviation of the composition is not easily generated. The piezoelectric/electrostrictive porcelain composition contains as a major component a piezoelectric/electrostrictive porcelain composition component including a $PbMg_{1/3}Nb_{2/3}O_3$—$PbZrO_3$—$PbTiO_3$ ternary solid solution system composition and NiO or including a $Pb(Mg, Ni)_{1/3}Nb_{2/3}O_3$—$PbZrO_3$—$PbTiO_3$ ternary solid solution system composition, and further contains lead germanate.

10 Claims, 6 Drawing Sheets

U.S. PATENT DOCUMENTS

| | | |
|---|---|---|
| 2003/0072972 A1 | 4/2003 | Kashiwaya et al. |
| 2004/0189152 A1 | 9/2004 | Kashiwaya |

FOREIGN PATENT DOCUMENTS

| | | |
|---|---|---|
| JP | S44-17103 B | 7/1969 |
| JP | 44-018030 | 8/1969 |
| JP | S45-8145 B | 3/1970 |
| JP | 62-212261 | 9/1987 |
| JP | 64-010505 | 1/1989 |
| JP | 01-100052 | 4/1989 |
| JP | 02-197181 | 8/1990 |
| JP | 02-197182 | 8/1990 |
| JP | 02-263761 | 10/1990 |
| JP | 06-191941 | 7/1994 |
| JP | 07-147111 | 6/1995 |
| JP | 2000-328223 A1 | 11/2000 |
| JP | 2002-100819 A1 | 4/2002 |
| JP | 2002-217464 | 8/2002 |
| JP | 2002-217465 | 8/2002 |
| JP | 2003-020274 A1 | 1/2003 |
| JP | 2004-304018 A1 | 10/2004 |

OTHER PUBLICATIONS

S.E. Aksenov et al., "The Role of Additives in Controlling Structure and Ferroelectric Properties of $Pb(Zr_{1-x}Ti_x)O_3$ ($0.05<x<0.15$) Ceramics", Ferroelectrics, 1997, vol. 199, pp. 231-234.

Pascal Tran-Huu-Hue et al., "Preparation and electromechanical properties of PZT/PGO thick films on alumina substrate", Journal of the European Ceramic Society 21 (2001) pp. 1445-1449.

F.F.C. Duval et al., "Lead germanium oxide sinter-assisted PZT composite thick films", Journal of the European Ceramic Society 23 (2003) pp. 1935-1941.

Stytsenko et al., "Airflow deposition of oxide electroceramic films," Journal of the European Ceramic Society 24 (2004) pp. 999-1003.

* cited by examiner

METHOD OF MANUFACTURING A PIEZOELECTRIC/ELECTROSTRICTIVE DEVICE

CROSS REFERENCE TO RELATED APPLICATION

This application is a division of U.S. application Ser. No. 11/321,281 filed Dec. 29, 2005, now U.S. Pat. No. 7,425,790, the entirety of which is incorporated herein by reference.

FIELD OF THE INVENTION

The present invention relates to a piezoelectric/electrostrictive porcelain composition, a piezoelectric/electrostrictive device, and a method of manufacturing a piezoelectric/electrostrictive device.

BACKGROUND OF THE INVENTION

Heretofore, piezoelectric/electrostrictive devices have been known to be capable of controlling micro displacement on the order of sub-microns. Piezoelectric/electrostrictive devices are especially suitable for the control of the micro displacement. In the device, a piezoelectric/electrostrictive body (piezoelectric/electrostrictive portion) formed of a piezoelectric/electrostrictive porcelain composition and an electrode portion to which a voltage is applied are laminated on a substrate made of a ceramic. Additionally, the device has superior characteristics such as a high electromechanical conversion efficiency, a high-speed response, a high durability, and a reduced power consumption. The piezoelectric/electrostrictive device is used in various applications such as a piezoelectric pressure sensor, a probe moving mechanism of a scanning type tunnel microscope, a rectilinear guide mechanism in an ultra-precise working device, a servo valve for hydraulic control, a head of a VTR device, a pixel constituting a flat panel type image display device, and a head of an ink jet printer.

Moreover, the piezoelectric/electrostrictive porcelain composition constituting the piezoelectric/electrostrictive body is also variously investigated. For example, there has been disclosed a $Pb(Mg_{1/3}Nb_{2/3})O_3$—$PbTiO_3$—$PbZrO_3$ ternary solid solution system composition, or a piezoelectric/electrostrictive porcelain composition in which a part of Pb in the composition is replaced with Sr, La or the like (see, e.g., Japanese Patent Publication No. 44-17103 and Japanese Patent Publication No. 45-8145). As to the piezoelectric/electrostrictive body itself which is the most important portion that determines a piezoelectric/electrostrictive characteristic of the piezoelectric/electrostrictive device, the piezoelectric/electrostrictive device is expected to be obtained which has a superior piezoelectric/electrostrictive characteristic (e.g., piezoelectric d constant).

On the other hand, it is disclosed that when the piezoelectric/electrostrictive body is formed using a piezoelectric/electrostrictive porcelain composition containing as a major component a predetermined PMN-PZ-PT ternary solid solution system composition containing Ni or oxide thereof, it is possible to manufacture a piezoelectric/electrostrictive device which has superior piezoelectric/electrostrictive characteristics and whose linearity of a flexural displacement with respect to an electric field is high up to a high electric field region (see, e.g., Japanese Patent Application Laid-Open No. 2002-217464 and Japanese Patent Application Laid-Open No. 2002-217465).

However, a raw piezoelectric/electrostrictive material needs to be sintered at a high temperature of 1200° C. or more so that the piezoelectric/electrostrictive body is denser, superior in crystallinity, and exhibits high piezoelectric/electrostrictive characteristics. Therefore, in addition to the problem that energy costs are high, there is a problem in that since it is difficult to use an Ag electrode or an Ag—Pd electrode having a comparatively low melting point, an electrode containing expensive Pt has to be used in many cases, and the article lacks in versatility. An element such as Pb or Ni contained in the piezoelectric/electrostrictive porcelain composition is gradually easily evaporated on high-temperature conditions at 1200° C. or more. Therefore, there are problems in that the finally resultant composition of the piezoelectric/electrostrictive body easily deviates from the expected composition, and in that it is difficult to obtain a piezoelectric/electrostrictive body exhibiting the desired piezoelectric/electrostrictive characteristics.

SUMMARY OF THE INVENTION

The present invention has been developed in view of such conventional technical problems, and an object thereof is to provide a piezoelectric/electrostrictive porcelain composition capable of manufacturing a piezoelectric/electrostrictive body which is dense and superior in crystallinity and which has satisfactory piezoelectric/electrostrictive characteristics at a comparatively low sintering temperature at which the composition does not easily deviate. An object of the present invention is to provide a piezoelectric/electrostrictive device provided with a piezoelectric/electrostrictive body which is dense and superior in crystallinity and which has satisfactory piezoelectric/electrostrictive characteristics.

Another object of the present invention is to provide a method of manufacturing a piezoelectric/electrostrictive device being dense and superior in crystallinity and having satisfactory piezoelectric/electrostrictive characteristics so that it is possible to easily manufacture the piezoelectric/electrostrictive device without easily causing deviation of a composition in a piezoelectric/electrostrictive body or the like.

As a result of intensive investigation by the present inventors in order to achieve these objects, it has been found that the above-described objects can be achieved when lead germanate is further contained in piezoelectric/electrostrictive porcelain composition components containing NiO or a predetermined ternary solid solution system composition including a Ni element in a structure thereof, and the present invention has been completed.

That is, according to the present invention, the following piezoelectric/electrostrictive porcelain composition, piezoelectric/electrostrictive device, and method of manufacturing a piezoelectric/electrostrictive device are provided.

According to a first aspect of a first embodiment of the present invention, a piezoelectric/electrostrictive porcelain composition is provided which contains as a major component, a piezoelectric/electrostrictive porcelain composition component including a $PbMg_{1/3}Nb_{2/3}O_3$—$PbZrO_3$—$PbTiO_3$ ternary solid solution system composition and NiO or including a $Pb(Mg, Ni)_{1/3}Nb_{2/3}O_3$—$PbZrO_3$—$PbTiO_3$ ternary solid solution system composition. The composition further contains lead germanate.

According to a second aspect of the present invention, the piezoelectric/electrostrictive porcelain composition according to the above first aspect is provided, wherein the piezoelectric/electrostrictive porcelain composition component contains the $PbMg_{1/3}Nb_{2/3}O_3$—$PbZrO_3$—$PbTiO_3$ ternary solid solution system composition as the main component, and 0.05 to 3% by mass of NiO, in a case where the piezoelectric/electrostrictive porcelain composition component includes the $PbMg_{1/3}Nb_{2/3}O_3$—$PbZrO_3$—$PbTiO_3$ ternary solid solution system composition and NiO.

According to a third aspect of the present invention, the piezoelectric/electrostrictive porcelain composition according to the above second aspect is provided, wherein the $PbMg_{1/3}Nb_{2/3}O_3$—$PbZrO_3$—$PbTiO_3$ ternary solid solution system composition is represented by the following composition formula $$Pb_x\{(Mg_{y/3}Nb_{2/3})_aTi_bZr_c\}O_3 \quad (1),$$

wherein $0.95 \leq x \leq 1.05$, $0.8 \leq y \leq 1.0$, and a, b, and c are decimals (with the proviso that a+b+c=1.00) in a range surrounded with (a, b, c)=(0.550, 0.425, 0.025), (0.550, 0.325, 0.125), (0.375, 0.325, 0.300), (0.050, 0.425, 0.525), (0.050, 0.525, 0.425), and (0.375, 0.425, 0.200) in a coordinate whose coordinate axes are a, b, and c described above.

According to a fourth aspect of the present invention, the piezoelectric/electrostrictive porcelain composition according to the first aspect is provided, wherein the $Pb(Mg, Ni)_{1/3}Nb_{2/3}O_3$—$PbZrO_3$—$PbTiO_3$ ternary solid solution system composition is represented by the following composition formula (2) in a case where the piezoelectric/electrostrictive porcelain composition component includes the $Pb(Mg, Ni)_{1/3}Nb_{2/3}O_3$—$PbZrO_3$—$PbTiO_3$ ternary solid solution system composition:

$$Pb_x\{(Mg_{1-y}Ni_y)_{(1/3)}\times_aNb_{2/3}\}_bTi_cZr_dO_3 \quad (2),$$

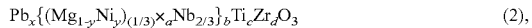

wherein $0.95 \leq x \leq 1.05$, $0.05 \leq y \leq 0.20$, $0.90 \leq a \leq 1.10$, and b, c, and d are decimals (with the proviso that (b+c+d)=1.000) in a range surrounded with (b, c, d)=(0.550, 0.425, 0.025), (0.550, 0.325, 0.125), (0.375, 0.325, 0.300), (0.050, 0.425, 0.525), (0.050, 0.525, 0.425), and (0.375, 0.425, 0.200) in a coordinate whose coordinate axes are b, c, and d described above.

According to a fifth aspect of the present invention, the piezoelectric/electrostrictive porcelain composition according to any one of the above aspects contains 0.3 to 4% by mass of lead germanate.

According to a sixth aspect of the present invention, the piezoelectric/electrostrictive porcelain composition according to any one of the above aspects is provided, wherein the lead germanate is at least one kind of material selected from the group consisting of $PbGeO_3$, $Pb_5Ge_3O_{11}$, $Pb_3GeO_5$, an eutectic of $PbGeO_3$ and $Pb_5Ge_3O_{11}$, and an eutectic of $Pb_5Ge_3O_{11}$ and $Pb_3GeO_5$.

According to a second embodiment of the present invention, a piezoelectric/electrostrictive device is provided, comprising a piezoelectric/electrostrictive body constituted by sintering the piezoelectric/electrostrictive porcelain composition according to any one of the above aspects and an electrode electrically connected to the piezoelectric/electrostrictive body.

According to a first aspect of the second embodiment of the present invention, in the piezoelectric/electrostrictive device, the piezoelectric/electrostrictive body comprises a large number of piezoelectric/electrostrictive porcelain grains formed of the piezoelectric/electrostrictive porcelain composition component, and wherein a grain boundary phase interposed between at least a part of the piezoelectric/electrostrictive porcelain grains and containing lead germanate as a major component.

According to a second aspect of the second embodiment of the present invention, in the piezoelectric/electrostrictive, the piezoelectric/electrostrictive body and the electrode have film-like shapes, wherein the piezoelectric/electrostrictive device further comprises a substrate made of a ceramic, and wherein the piezoelectric/electrostrictive body is solidly attached onto the substrate directly or via the electrode.

According to a third aspect of the second embodiment of the present invention, the piezoelectric/electrostrictive device according to any one of the above aspects of the second embodiment is provided, which further comprises a plurality of piezoelectric/electrostrictive bodies, and a plurality of electrodes, wherein the plurality of piezoelectric/electrostrictive bodies are alternately sandwiched and laminated between the plurality of electrodes.

A third embodiment of the present invention provides a method of manufacturing a piezoelectric/electrostrictive device that is provided with a piezoelectric/electrostrictive body and an electrode electrically connected to the piezoelectric/electrostrictive body. A first method comprises the steps of mixing and sintering first particles containing, as a major component, a piezoelectric/electrostrictive porcelain composition component including a $PbMg_{1/3}Nb_{2/3}O_3$—$PbZrO_3$—$PbTiO_3$ ternary solid solution system composition and NiO or including a $Pb(Mg, Ni)_{1/3}Nb_{2/3}O_3$—$PbZrO_3$—$PbTiO_3$ ternary solid solution system composition, and containing second particles formed of lead germanate to thereby form a piezoelectric/electrostrictive body (hereinafter referred to as "the first method of manufacturing a piezoelectric/electrostrictive device").

According to a first aspect of the first method of manufacturing the piezoelectric/electrostrictive device according to the present invention, an average particle diameter of the second particles is smaller than that of the first particles.

According to a second aspect of the first method of manufacturing the piezoelectric/electrostrictive device according to the present invention, the first and second particles are mixed and sintered to thereby form the piezoelectric/electrostrictive body into a film shape and solidly attach the piezoelectric/electrostrictive body onto the substrate made of the ceramic directly or via the film-like electrode.

According to another aspect of the third embodiment of the present invention, a second method of manufacturing a piezoelectric/electrostrictive device that is provided with a piezoelectric/electrostrictive body and an electrode electrically connected to the piezoelectric/electrostrictive body. The method comprises the steps of mixing first particles containing, as a major component, a piezoelectric/electrostrictive porcelain composition component including a $PbMg_{1/3}Nb_{2/3}O_3$—$PbZrO_3$—$PbTiO_3$ ternary solid solution system composition and NiO or including a $Pb(Mg, Ni)_{1/3}Nb_{2/3}O_3$—$PbZrO_3$—$PbTiO_3$ ternary solid solution system composition with second particles made of lead germanate to obtain a mixture, calcining the resultant mixture at a temperature of 550 to 900° C. to obtain a calcined body, grinding the resultant calcined body to obtain ground particles, and sintering the resultant grinded particles to form the piezoelectric/electrostrictive body (hereinafter referred to as "the second method of manufacturing a piezoelectric/electrostrictive device").

According to a first aspect of the second method of manufacturing the piezoelectric/electrostrictive device according to the present invention, the ground particles are piezoelectric/electrostrictive porcelain particles containing the piezoelectric/electrostrictive porcelain composition component as a major component, and 30% by mass or more of coated particles at least a part of which on an outer peripheral surface are coated with lead germanate.

According to a second aspect of the second method of manufacturing the piezoelectric/electrostrictive device according to the present invention, the ground particles are sintered to thereby form the piezoelectric/electrostrictive body into a film shape and solidly attach the piezoelectric/electrostrictive body onto a substrate made of a ceramic directly or via the film-like electrode.

In the first and second methods of manufacturing the piezoelectric/electrostrictive device according to the above aspects, the lead germanate is at least one kind selected from the group consisting of $PbGeO_3$, $Pb_5Ge_3O_{11}$, $Pb_3GeO_5$, an eutectic of $PbGeO_3$ and $Pb_5Ge_3O_{11}$, and an eutectic of $Pb_5Ge_3O_{11}$ and $Pb_3GeO_5$.

In the first and second methods of manufacturing the piezoelectric/electrostrictive device according to the above aspects, the first and second particles are mixed after thermally treating the first particles beforehand at a temperature of 1100 to 1300° C.

The piezoelectric/electrostrictive device described above includes a piezoelectric/electrostrictive device comprising a piezoelectric/electrostrictive body formed of piezoelectric/electrostrictive porcelain composition, and electrodes formed on the piezoelectric/electrostrictive body applying voltage on the piezoelectric/electrostrictive body. In addition, the piezoelectric/electrostrictive device described above also includes a piezoelectric/electrostrictive device laminating a piezoelectric/electrostrictive body (piezoelectric/electrostrictive portion) and electrodes on the substrate made of ceramics. Moreover, the piezoelectric/electrostrictive device described above also includes a piezoelectric/electrostrictive device alternately laminating a plurality of piezoelectric/electrostrictive bodies (piezoelectric/electrostrictive portions) formed of piezoelectric/electrostrictive porcelain composition and a plurality of electrodes.

The composite piezoelectric/electrostrictive porcelain composition of the present invention makes it possible to manufacture a piezoelectric/electrostrictive body which is dense and superior in crystallinity and which has satisfactory piezoelectric/electrostrictive characteristics at a comparatively low sintering temperature at which deviation of the composition or the like is not easily caused.

The piezoelectric/electrostrictive device of the present invention is provided with a piezoelectric/electrostrictive body which is dense and superior in crystallinity and which has satisfactory piezoelectric/electrostrictive characteristics, and produces an effect that a large displacement is exhibited.

According to the methods of manufacturing the piezoelectric/electrostrictive device of the present invention, it is possible to easily manufacture the piezoelectric/electrostrictive device which is dense and superior in crystallinity and which has satisfactory piezoelectric/electrostrictive characteristics without easily causing the deviation of the composition or the like.

DETAILED DESCRIPTION OF THE INVENTION

Figure 1:
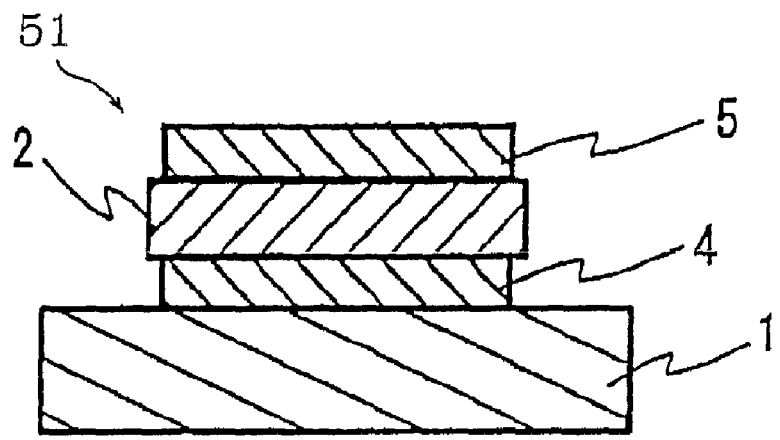
FIG. 1 is a sectional view schematically showing one embodiment of a piezoelectric/electrostrictive device according to the present invention.

A preferred mode for carrying out the present invention will be described hereinafter, but it should be understood that the present invention is not limited to the following embodiments, and the present invention includes appropriate alterations, modifications and the like added to the following embodiments based on the ordinary knowledge of a person skilled in the art without departing from the scope of the present invention. It is to be noted that when "a method of manufacturing a piezoelectric/electrostrictive device of the present invention (the present embodiment)" is simply mentioned in the present specification, both of first and second methods of manufacturing the piezoelectric/electrostrictive devices are indicated.

One embodiment of a piezoelectric/electrostrictive porcelain composition of the present invention relates to a composite piezoelectric/electrostrictive porcelain composition containing, as a major component, a piezoelectric/electrostrictive porcelain composition component comprising a $PbMg_{1/3}Nb_{2/3}O_3$—$PbZrO_3$—$PbTiO_3$ ternary solid solution system composition and NiO, or a $Pb(Mg, Ni)_{1/3}Nb_{2/3}O_3$—$PbZrO_3$—$PbTiO_3$ ternary solid solution system composition, and further containing lead germanate. Details will be described hereinafter.

The piezoelectric/electrostrictive porcelain composition component which is the main component of the composite piezoelectric/electrostrictive porcelain composition of the present embodiment is (1) the component containing the $PbMg_{1/3}Nb_{2/3}O_3$—$PbZrO_3$—$PbTiO_3$ ternary solid solution system composition and NiO, or (2) the component containing the $Pb(Mg, Ni)_{1/3}Nb_{2/3}O_3$—$PbZrO_3$—$PbTiO_3$ ternary solid solution system composition.

Moreover, the piezoelectric/electrostrictive porcelain composition of the present embodiment further contains lead germanate. In general, the melting point of lead germanate is low as compared with the temperature (1200° C. or more) at which a conventional PZT-based piezoelectric/electrostrictive porcelain composition is sintered. Therefore, when the piezoelectric/electrostrictive porcelain composition contains a predetermined amount of lead germanate, it is possible to manufacture the piezoelectric/electrostrictive body or portion which is dense and superior in crystallinity and at a sintering temperature lower than a conventional temperature. Furthermore, the present embodiment can also contribute to the reduction of energy costs or the amount of discharged carbon dioxide. Moreover, it is possible to use an Ag—Pd electrode whose melting point is lower than that of a Pt electrode.

Furthermore, since the composition can be sintered at a low sintering temperature, it is possible to inhibit elements such as Pb and Ni from being evaporated during high temperature sintering. Therefore, it is possible to obtain a piezoelectric/electrostrictive body or the like in which the composition of the resultant piezoelectric/electrostrictive body or portion does not easily deviate from the expected composition, and which exhibits desired piezoelectric/electrostrictive characteristics. For example, the sintering of a ceramic substrate is possible at a lower sintering temperature. Therefore, it is possible to inhibit reactions between elements constituting the piezoelectric/electrostrictive porcelain composition and the ceramic substrate. Consequently, the composition of the resultant piezoelectric/electrostrictive portion does not easily deviate from the expected composition.

When the piezoelectric/electrostrictive porcelain composition component contains a $PbMg_{1/3}Nb_{2/3}O_3$—$PbZrO_3$—$PbTiO_3$ ternary solid solution system composition and NiO, the piezoelectric/electrostrictive porcelain composition component preferably contains the $PbMg_{1/3}Nb_{2/3}O_3$—$PbZrO_3$—$PbTiO_3$ ternary solid solution system composition as a major component, and preferably 0.05 to 3%, more preferably 0.07 to 2.5, especially preferably 0.10 to 2% by mass of NiO. When a content of NiO is defined in the above-described numerical value range, it is possible to inhibit a hetero-phase in the resultant piezoelectric/electrostrictive body and portion. It is possible to form the piezoelectric/electrostrictive body or portion in which an occupying ratio of a perovskite phase contributing to an electric field induced strain is large and which is dense and superior in crystallinity and which has remarkably high piezoelectric/electrostrictive characteristics.

It is to be noted that the "main component" in the "the $PbMg_{1/3}Nb_{2/3}O_3$—$PbZrO_3$—$PbTiO_3$ ternary solid solution system composition as the main component" mentioned in the present specification indicates that a content ratio of the $PbMg_{1/3}Nb_{2/3}O_3$—$PbZrO_3$—$PbTiO_3$ ternary solid solution system composition is 99.5% or more, preferably 99.8% or more by mass with respect to all of the piezoelectric/electrostrictive porcelain composition components excluding NiO.

In the piezoelectric/electrostrictive porcelain composition of the present embodiment, the $PbMg_{1/3}Nb_{2/3}O_3$—$PbZrO_3$—$PbTiO_3$ ternary solid solution system composition is preferably represented by the following composition formula (1) because it is possible to form the piezoelectric/electrostrictive body or portion having higher piezoelectric/electrostrictive characteristics:

$$Pb_x\{(Mg_{y/3}Nb_{2/3})_a Ti_b Zr_c\}O_3 \quad (1),$$

wherein $0.95 \leq x \leq 1.05$, $0.8 \leq y \leq 1.0$, and a, b, and c are decimals (with the proviso that a+b+c=1.00) in a range surrounded with (a, b, c)=(0.550, 0.425, 0.025), (0.550, 0.325, 0.125), (0.375, 0.325, 0.300), (0.050, 0.425, 0.525), (0.050, 0.525, 0.425), and (0.375, 0.425, 0.200) in a coordinate whose coordinate axes are a, b, and c described above.

On the other hand, when the piezoelectric/electrostrictive porcelain composition component contains a $Pb(Mg, Ni)_{1/3}Nb_{2/3}O_3$—$PbZrO_3$—$PbTiO_3$ ternary solid solution system composition, the $Pb(Mg, Ni)_{1/3}Nb_{2/3}O_3$—$PbZrO_3$—$PbTiO_3$ ternary solid solution system composition is preferably represented by the following composition formula (2) because it is possible to form the piezoelectric/electrostrictive body or portion having higher piezoelectric/electrostrictive characteristics:

$$Pb_x\{(Mg_{1-y}Ni_y)_{(1/3)\times a}Nb_{2/3}\}_b Ti_c Zr_d O_3 \quad (2),$$

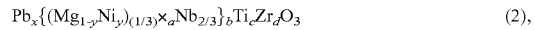

wherein $0.95 \leq x \leq 1.05$, $0.05 \leq y \leq 0.20$, $0.90 \leq a \leq 1.10$, and b, c, and d are decimals (with the proviso that (b+c+d)=1.000) in a range surrounded with (b, c, d)=(0.550, 0.425, 0.025), (0.550, 0.325, 0.125), (0.375, 0.325, 0.300), (0.050, 0.425, 0.525), (0.050, 0.525, 0.425), and (0.375, 0.425, 0.200) in a coordinate whose coordinate axes are b, c, and d described above.

In the piezoelectric/electrostrictive porcelain composition of the present embodiment, it is preferable to replace Pb among the piezoelectric/electrostrictive porcelain composition components with at least one kind of element selected from the group consisting of Sr, Ba, La, and Bi because it is possible to further enhance the piezoelectric/electrostrictive characteristics of the resultant piezoelectric/electrostrictive article or portion.

When Pb is replaced with at least one kind of element selected from the group consisting of Sr, Ba, La, and Bi at a high replacement ratio, the piezoelectric/electrostrictive characteristics of the resultant piezoelectric/electrostrictive body or portion are deteriorated, and fluctuations of the piezoelectric/electrostrictive characteristics due to a temperature change increase in some case. Therefore, when a part of Pb is replaced with Sr and/or Ba, preferably 3 to 10 mol %, more preferably 5 to 8 mol % of Pb is replaced with Sr and/or Ba. When a part of Pb is replaced with La and/or Bi, preferably 0.2 to 1.0 mol %, more preferably 0.4 to 0.9 mol % of Pb is replaced with La and/or Bi.

In the piezoelectric/electrostrictive porcelain composition of the present embodiment, it is preferable to replace Ti among the piezoelectric/electrostrictive porcelain composition components with at least one kind of element selected from the group consisting of Nb, Ta, W, and Mo because the piezoelectric/electrostrictive characteristics of the resultant piezoelectric/electrostrictive body or portion can be further enhanced. It is to be noted that preferably 3 to 10 mol %, more preferably 5 to 8 mol % of Ti is replaced with at least one kind of element selected from the group consisting of Nb, Ta, W, and Mo.

In the piezoelectric/electrostrictive porcelain composition of the present embodiment, it is preferable to contain at least one kind of compound selected from the group consisting of $MnO_2$, $CeO_2$, and $SiO_2$, because it is possible to further enhance the piezoelectric/electrostrictive characteristics of the resultant piezoelectric/electrostrictive body or portion. It is to be noted that the content ratio of at least one kind of compound selected from the group consisting of $MnO_2$, $CeO_2$, and $SiO_2$ is preferably 0.05 to 5% by mass, more preferably 0.1 to 2% by mass.

The piezoelectric/electrostrictive porcelain composition of the present embodiment is essentially preferably formed of piezoelectric/electrostrictive porcelain composition components including a $PbMg_{1/3}Nb_{2/3}O_3$—$PbZrO_3$—$PbTiO_3$ ternary solid solution system composition and NiO, or a $Pb(Mg, Ni)_{1/3}Nb_{2/3}O_3$—$PbZrO_3$—$PbTiO_3$ ternary solid solution system composition, and lead germanate. It is to be noted that in the piezoelectric/electrostrictive porcelain composition of the present embodiment, the content of lead germanate is preferably 0.3 to 4% by mass, more preferably 0.3 to 3% by mass, especially preferably 0.3 to 1.8% by mass. When the content of lead germanate is less than 0.3% by mass, the composition is not densified at a low sintering temperature in some case. On the other hand, when the content of lead germanate exceeds 4% by mass, a portion occupied by lead germanate having whose piezoelectric/electrostrictive characteristics are low or absent increases, and therefore the piezoelectric/electrostrictive characteristics are sometimes deteriorated.

In the piezoelectric/electrostrictive porcelain composition of the present embodiment, lead germanate is preferably at least one of $PbGeO_3$, $Pb_5Ge_3O_{11}$, $Pb_3GeO_5$, an eutectic of $PbGeO_3$ and $Pb_5Ge_3O_{11}$, and an eutectic of $Pb_5Ge_3O_{11}$ and $Pb_3GeO_5$. In the case where the lead germanate is $PbGeO_3$, even when the lead germanate reacts with the perovskite and is dissolved, PbO rarely becomes hetero-phase, and the characteristics are preferably inhibited from being deteriorated. In the case where the lead germanate is $Pb_5Ge_3O_{11}$, since $Pb_5Ge_3O_{11}$ itself is ferroelectric, the piezoelectric/electrostrictive characteristics of the resultant piezoelectric/electrostrictive body or portion can be preferably inhibited from being deteriorated. Furthermore, in a case where lead germanate is $Pb_3GeO_5$, since Pb in $Pb_3GeO_5$ is evaporated, Pb can be inhibited from being evaporated from the piezoelectric/electrostrictive porcelain composition components, and the characteristics of the piezoelectric/electrostrictive porcelain composition can be preferably inhibited from being deteriorated.

On the other hand, the eutectic of $PbGeO_3$ and $Pb_5Ge_3O_{11}$ or that of $Pb_5Ge_3O_{11}$ and $Pb_3GeO_5$ has a melting point (melting point of the eutectic of $PbGeO_3$ and $Pb_5Ge_3O_{11}$=710° C., melting point of eutectic of $Pb_5Ge_3O_{11}$ and $Pb_3GeO_5$) that is lower than that of each single compound (melting point of $PbGeO_3$=810° C., melting point of $Pb_5Ge_3O_{11}$=743° C., melting point of $Pb_3GeO_5$=745° C.). Therefore, it is preferably possible to manufacture the piezoelectric/electrostrictive body or portion which is dense and superior in crystallinity while exhibiting superiority in a case where each single compound is used at a lower sintering temperature.

Additionally, in Japanese Patent No. 2643154, there is disclosed a pyroelectric porcelain composition capable of obtaining a pyroelectric porcelain which contains a $Pb[(Mg_{1/3}Nb_{2/3}), Ti, Zr]O_3$-based porcelain composition as a major component, and $Pb_5Ge_3O_{11}$ as a sub-component and which is dense and which has a large mechanical strength. However, this publication does not disclose or suggest that NiO is contained in the porcelain composition, the publication does not disclose or suggest effects, such as inhibition of hetero-phase formation or increase of the ratio occupied by the perovskite phase, produced in a case where NiO is contained in the porcelain composition. As to lead germanate, $Pb_5Ge_3O_{11}$ is only disclosed. There is no disclosure or suggestion of superiority in a case where another compound or eutectic is contained, and the constitution is apparently different from that of the piezoelectric/electrostrictive porcelain composition of the present invention.

To obtain a Pb-based piezoelectric/electrostrictive porcelain composition, it is usually necessary to sinter the composition at a high temperature of about 1200° C. Therefore, it is necessary to add a low-melting-point material such as a glass in order to sinter the composition at a low temperature of about 1000° C. and obtain the piezoelectric/electrostrictive porcelain composition. However, the piezoelectric/electrostrictive porcelain composition sometimes reacts with the additive depending on a combination of the piezoelectric/electrostrictive porcelain composition with the additive. Even if the composition is sintered at a low temperature, the characteristics are remarkably deteriorated in some case. In the present embodiment, since the piezoelectric/electrostrictive porcelain composition contains NiO, there are advantages in that the reactivity with the lead germanate is low, and the characteristics are only slightly deteriorated.

Next, an embodiment of the piezoelectric/electrostrictive device of the present invention will be described. In the present embodiment, the piezoelectric/electrostrictive device is provided with a piezoelectric/electrostrictive body constituted by sintering any of the piezoelectric/electrostrictive porcelain compositions according to the embodiment of the present invention described above, and an electrode electrically connected to this piezoelectric/electrostrictive body. That is, in the present embodiment, the piezoelectric/electrostrictive device is provided with a piezoelectric/electrostrictive body constituted by sintering a piezoelectric/electrostrictive porcelain composition containing, as a major component, a piezoelectric/electrostrictive porcelain composition components including a $PbMg_{1/3}Nb_{2/3}O_3$—$PbZrO_3$—$PbTiO_3$ ternary solid solution system composition and NiO, or a $Pb(Mg, Ni)_{1/3}Nb_{2/3}O_3$—$PbZrO_3$—$PbTiO_3$ ternary solid solution system composition, and further containing lead germanate. An electrode is electrically connected to this piezoelectric/electrostrictive body.

As described above, in the embodiment of the present invention, the piezoelectric/electrostrictive porcelain composition contains, as a major component, the piezoelectric/electrostrictive porcelain composition component including NiO or a predetermined ternary solid solution system composition containing an Ni element in a structure thereof, and further contains lead germanate. Therefore, in the piezoelectric/electrostrictive body constituted by sintering this piezoelectric/electrostrictive porcelain composition, the hetero-phase is inhibited from being formed, and the ratio occupied by the perovskite phase constituting an electric field induced strain is large. Moreover, the body is dense and superior in crystallinity, and has satisfactory piezoelectric/electrostrictive characteristics. Furthermore, since lead germanate is included, the body is obtained at a comparatively low sintering temperature. Therefore, in the piezoelectric/electrostrictive device of the present embodiment, it is possible to positively use an Ag—Pd electrode whose melting point is lower than that of a Pt electrode, and the device is also superior in energy cost or versatility.

In the piezoelectric/electrostrictive device of the present embodiment, the piezoelectric/electrostrictive body constituting the device is preferably formed of a large number of piezoelectric/electrostrictive porcelain grains containing the piezoelectric/electrostrictive porcelain composition components, and a grain boundary phase interposed between at least a part of the piezoelectric/electrostrictive porcelain grains and containing lead germanate as the main component. That is, the grain boundary phase containing, as the main component, lead germanate having a specific permittivity larger than that of pores exists so as to fill in gaps among the large number of piezoelectric/electrostrictive porcelain grains formed of the piezoelectric/electrostrictive porcelain composition components. Therefore, the piezoelectric/electrostrictive device of the present embodiment has more satisfactory piezoelectric/electrostrictive characteristics.

Moreover, in the piezoelectric/electrostrictive device of the present embodiment, a germanium (Ge) element constituting the lead germanate is diffused in the piezoelectric/electrostrictive porcelain grains constituting the piezoelectric/electrostrictive body. This is preferable to enhance the strength of the piezoelectric/electrostrictive body. It is to be noted that EPMA analysis can be used to determine whether or not the Ge element is diffused in the piezoelectric/electrostrictive porcelain grains or to which extent the element is diffused (diffusion depth).

In the piezoelectric/electrostrictive device of the present embodiment, an average grain diameter of crystal grains constituting the piezoelectric/electrostrictive body is preferably 0.1 to 10 μm, more preferably 0.2 to 8.5 μm, especially preferably 0.3 to 7 μm. When the average grain diameter is less than 1 μm, a domain does not sufficiently develop in the piezoelectric/electrostrictive body, and deteriorations of the piezoelectric/electrostrictive characteristics are caused easily in some cases. On the other hand, when the average grain diameter exceeds 10 μm, the domain in the piezoelectric/electrostrictive body sufficiently develops, but the domain does not move easily, and the piezoelectric/electrostrictive characteristics are reduced in some cases. It is to be noted that the piezoelectric/electrostrictive body and the electrode constituting the piezoelectric/electrostrictive device of the present embodiment can be formed into various shapes. Typically preferable examples of the shape include a block shape (so-called bulk body), a sheet shape (film shape) and a multilayered constitution.

Next, the embodiment of the piezoelectric/electrostrictive device of the present invention will be described specifically with reference to the drawings. FIG. 1 is a sectional view schematically showing one embodiment of the piezoelectric/electrostrictive device of the present invention. As shown in FIG. 1, a piezoelectric/electrostrictive device 51 of the present embodiment is provided with: a substrate 1 made of a ceramic; a film-like piezoelectric/electrostrictive body 2; and film-like electrodes 4, 5 electrically connected to this piezoelectric/electrostrictive body 2, and the piezoelectric/electrostrictive body 2 is solidly attached onto the substrate 1 via the electrode 4. It is to be noted that the piezoelectric/electrostrictive body may be solidly attached directly onto the substrate without interposing any electrode. It is to be noted that "solidly attached" mentioned in the present specification indicates that the piezoelectric/electrostrictive body 2 is formed closely integrally with the substrate 1 or the electrode 4 by a solid-phase reaction therebetween without using any organic or inorganic adhesive.

The piezoelectric/electrostrictive body 2 of the piezoelectric/electrostrictive device 51 of the present embodiment is constituted by sintering any of the piezoelectric/electrostrictive porcelain compositions according to the above-described embodiment of the present invention. That is, in the piezoelectric/electrostrictive device 51 of the present embodiment, the piezoelectric/electrostrictive body 2 is constituted by sintering the piezoelectric/electrostrictive porcelain composition which contains, as a major component, the piezoelectric/electrostrictive porcelain composition component including the $PbMg_{1/3}Nb_{2/3}O_3$—$PbZrO_3$—$PbTiO_3$ ternary solid solution system composition and NiO, or the $Pb(Mg, Ni)_{1/3}Nb_{2/3}O_3$—$PbZrO_3$—$PbTiO_3$ ternary solid solution system composition, and further contains lead germanate.

As described above, the piezoelectric/electrostrictive porcelain composition contains, as the main component, the piezoelectric/electrostrictive porcelain composition component including NiO or the predetermined ternary solid solution system composition containing the Ni element in the structure thereof, and further contains lead germanate. Therefore, in the piezoelectric/electrostrictive body 2 formed by sintering this piezoelectric/electrostrictive porcelain composition, a hetero-phase is inhibited from being formed, and the ratio occupied by the perovskite phase contributing to the electric field induced strain is large. Moreover, the body is dense and superior in crystallinity. Therefore, in the present embodiment, the piezoelectric/electrostrictive device 51 provided with the piezoelectric/electrostrictive body 2 has satisfactory piezoelectric/electrostrictive characteristics and can obtain a large displacement. Furthermore, since the piezoelectric/electrostrictive porcelain composition contains lead germanate, the piezoelectric/electrostrictive body 2 can be formed at a comparatively low sintering temperature. Therefore, it is possible to use an Ag—Pd electrode whose melting point is lower than that of a Pt electrode. The device is also superior in energy cost or versatility.

In the piezoelectric/electrostrictive device 51 of the present embodiment, the piezoelectric/electrostrictive body 2 is preferably formed of a large number of piezoelectric/electrostrictive porcelain grains containing the piezoelectric/electrostrictive porcelain composition components, and a grain boundary phase interposed between at least a part of the piezoelectric/electrostrictive porcelain grains and containing lead germanate as the main component. That is, the grain boundary phase containing lead germanate as the main component exists so as to fill in gaps among the large number of piezoelectric/electrostrictive porcelain grains formed of the piezoelectric/electrostrictive porcelain composition components. Therefore, in the piezoelectric/electrostrictive device 51 of the present embodiment, the piezoelectric/electrostrictive body 2 is constituted to be denser. Therefore, the piezoelectric/electrostrictive device 51 can exhibit more satisfactory piezoelectric/electrostrictive characteristics and obtain a larger displacement.

Moreover, in the piezoelectric/electrostrictive device 51 of the present embodiment, a germanium (Ge) element constituting lead germanate is diffused in the piezoelectric/electrostrictive porcelain grains constituting the piezoelectric/electrostrictive body 2. This is preferable with respect to enhancing the strength of the piezoelectric/electrostrictive body. It is to be noted that EPMA analysis can be used to determine whether or not the Ge element is diffused in the piezoelectric/electrostrictive porcelain grains or to determine the extent to which the element is diffused (diffusion depth).

In the piezoelectric/electrostrictive device 51 of the present embodiment, an average grain diameter of crystal grains constituting the piezoelectric/electrostrictive body 2 is preferably 0.1 to 10 μm, more preferably 0.2 to 8.5 μm, especially preferably 0.3 to 7 μm. When the average grain diameter is less than 1 μm, a domain does not sufficiently develop in the piezoelectric/electrostrictive body 2, and deteriorations of flexural displacement and linearity of the flexural displacement with respect to an electric field in a high electric field region are deteriorated in some cases. On the other hand, when the average grain diameter exceeds 10 μm, the domain in the piezoelectric/electrostrictive body 2 sufficiently develops, but the domain does not move easily, and the flexural displacement is reduced in some cases.

Figure 3:
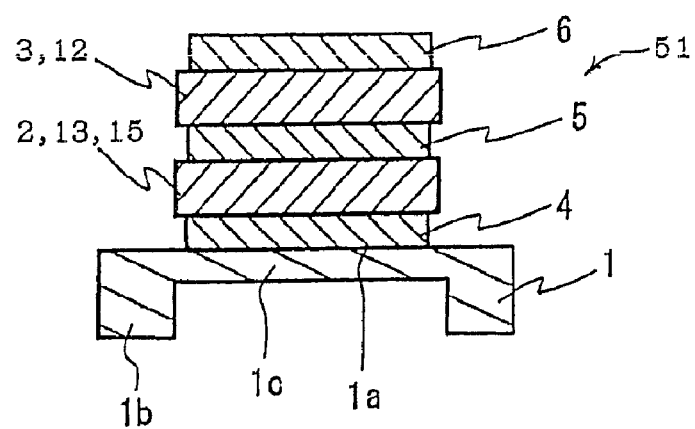
FIG. 3 is a sectional view schematically showing still another embodiment of the piezoelectric/electrostrictive device according to the present invention.

Moreover, as shown in FIG. 3, in the present embodiment, the piezoelectric device 51 may have a constitution which is provided with a plurality of piezoelectric/electrostrictive bodies 2, 3, and a plurality of electrodes 4, 5, and 6 and in which the plurality of piezoelectric/electrostrictive bodies 2, 3 are alternately sandwiched and laminated between the plurality of electrodes 4, 5, and 6. This constitution is a so-called multilayered constitution, and a large flexural displacement can be preferably obtained at a low voltage.

In the piezoelectric/electrostrictive device 51 (see FIG. 1) of the present embodiment, the thickness of the piezoelectric/electrostrictive body 2 is preferably 0.5 to 50 μm, more preferably 0.8 to 40 μm, especially preferably 1.0 to 30 μm. When the thickness of the piezoelectric/electrostrictive body 2 is less than 0.5 μm, even a piezoelectric/electrostrictive body formed of a piezoelectric/electrostrictive porcelain composition according to the present invention is insufficiently densified in some cases. On the other hand, when the thickness of the piezoelectric/electrostrictive body 2 exceeds 50 μm, contraction stresses of the piezoelectric/electrostrictive porcelain composition increase at during sintering, and the substrate 1 needs to be thicker in order to prevent from the substrate 1 from being broken. Therefore, it is sometimes difficult to cope with miniaturization of the device. It is to be noted that as shown in FIG. 3, the thicknesses of the piezoelectric/electrostrictive bodies 2, 3 in a case where the piezoelectric/electrostrictive device 51 has a so-called multilayered constitution refer to the respective thicknesses of the piezoelectric/electrostrictive bodies 2, 3.

The substrate constituting the piezoelectric/electrostrictive device according to the present invention is made of a ceramic, and the kind of ceramic is not restricted. This ceramic preferably contains at least one material selected from the group consisting of stabilized zirconium oxide, aluminum oxide, magnesium oxide, mullite, aluminum nitride, silicon nitride, and glass with respect to providing heat resistance, chemical stability, and insulating properties. Above all, stabilized zirconium oxide is more preferable because its mechanical strength is large and its tenacity is superior. It is to be noted that "stabilized zirconium oxide" refers to zirconium oxide in which phase transition of crystals is inhibited by addition of a stabilizer, and partially stabilized zirconium oxide is included in addition to stabilized zirconium oxide.

Examples of stabilized zirconium oxide include zirconium oxide containing as the stabilizer 1 to 30 mol % of calcium oxide, magnesium oxide, yttrium oxide, scandium oxide, ytterbium oxide, cerium oxide, or oxide of a rare earth metal. Above all, zirconium oxide containing yttrium oxide as the stabilizer is preferable because the mechanical strength of a vibrating portion is especially high. In this case, zirconium oxide preferably contains 1.5 to 6 mol % yttrium oxide, and more preferably 2 to 4 mol % yttrium oxide. Zirconium oxide more preferably contains 0.1 to 5 mol % of aluminum oxide. A crystal phase of stabilized zirconium oxide may be a mixed phase of a cubic system+a monoclinic system, a mixed phase of a tetragonal system+the monoclinic system, a mixed phase of the cubic system+the tetragonal system+the monoclinic system or the like. However, a main crystal phase of the tetragonal system, or the mixed phase of the tetragonal system+the cubic system, is preferable from viewpoints of strength, tenacity, and durability.

It is to be noted that the thickness of the substrate is preferably 1 μm to 1 mm, more preferably 1.5 to 500 μm, and especially preferably 2 to 200 μm. When the thickness of the substrate is less than 1 μm, the mechanical strength of the piezoelectric/electrostrictive device is sometimes deteriorated. On the other hand, in the case where the thickness exceeds 1 mm, when voltage is applied to the piezoelectric/electrostrictive body, the rigidity of the substrate increases with respect to the generated contraction stress, and the flexural displacement of the piezoelectric/electrostrictive body is reduced in some cases.

Figure 2:
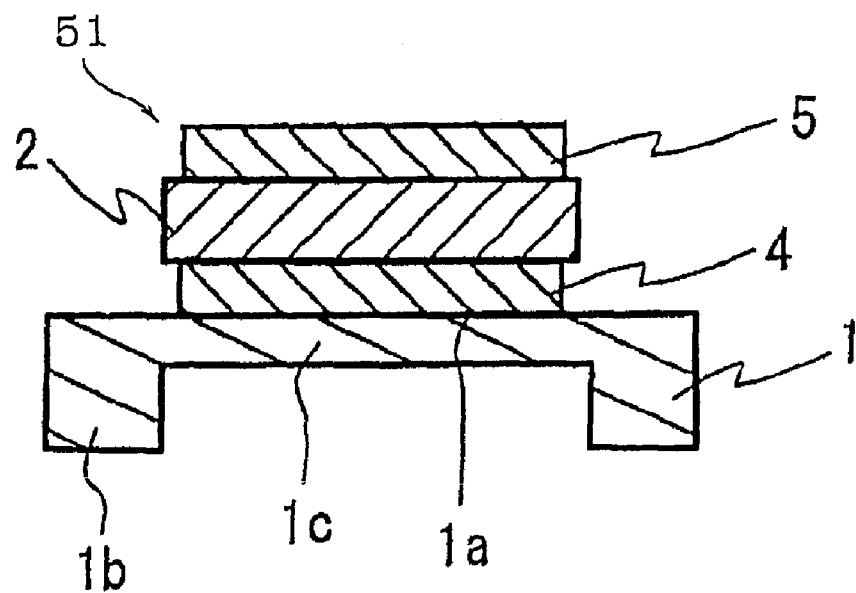
FIG. 2 is a sectional view schematically showing another embodiment of the piezoelectric/electrostrictive device according to the present invention.
Figure 4:
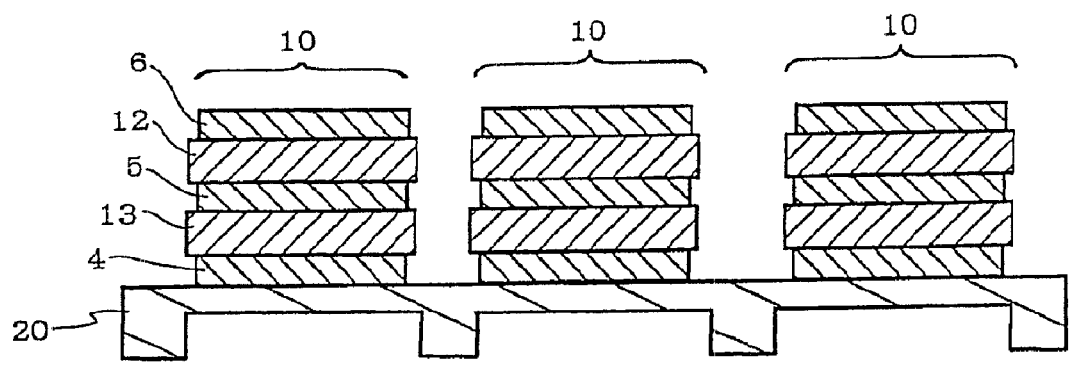
FIG. 4 is a sectional view schematically showing still another embodiment of the piezoelectric/electrostrictive device of the present invention.

However, as shown in FIG. 2, the substrate 1 may be formed into a shape provided with a thin portion 1c whose one surface is provided with a solidly attached surface 1a and which has the above-described thickness, and a thick portion 1b which is thicker than the thin portion 1c disposed in a portion other than a portion corresponding to the solidly attached surface 1a. It is to be noted that the electrode 4 (or the piezoelectric/electrostrictive body) is disposed in a region substantially corresponding to the solidly attached surface 1a. Since the substrate 1 is formed into such a shape, it is possible to constitute a piezoelectric/electrostrictive device whose flexural displacement is sufficient large and whose mechanical strength is large. A common substrate 20 is used in which the shape of the substrate 1 shown in FIG. 2 is continuously formed as shown in FIG. 4. On this common substrate 20, there can be disposed a plurality of piezoelectric/electrostrictive device units 10 each including a first piezoelectric/electrostrictive body 12, a second piezoelectric/electrostrictive body 13, and electrodes 4, 5, and 6.

There is not any special restriction on shape of the surface of the substrate to which the electrode 4 is solidly attached in FIG. 1 in the piezoelectric/electrostrictive device of the present invention. Examples of a suitable surface shape include a rectangular shape, a square shape, a triangular shape, an elliptical shape, a circular shape, a curved square shape, a curved rectangular shape, and a composite shape of a combination of these shapes. There is not any special restriction on the overall shape of the substrate, and the substrate may have a capsule shape having an appropriate internal space.

Figure 7:
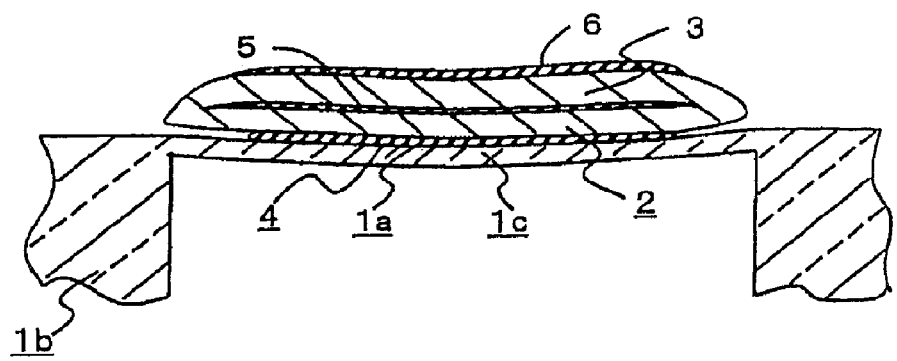
FIG. 7 is a sectional view showing another example of the embodiment shown in FIG. 3 in more detail.
Figure 8:
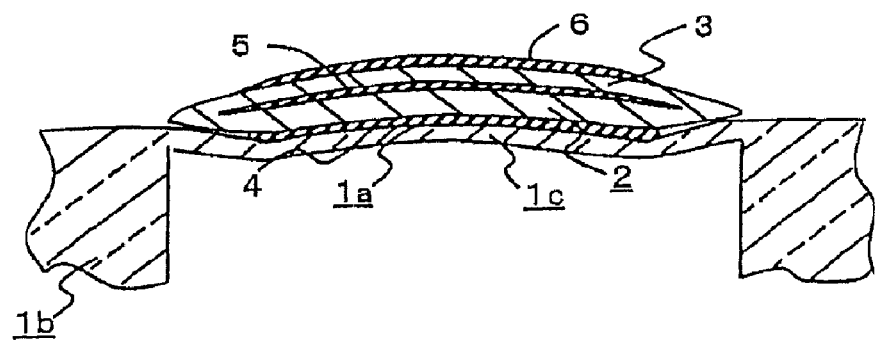
FIG. 8 is a sectional view showing still another example of the embodiment shown in FIG. 3 in more detail.

Moreover, as to the shape of the thin portion of the substrate, from the view that the linearity of the flexural displacement with respect to the electric field is high, the center of the thin portion preferably has a shape that is bent on a side opposite to a side on which the piezoelectric bodies 2, 3 are disposed as shown in FIG. 7, or a sectional shape in a thickness direction that has a so-called W-shape as shown in FIG. 8. In this shape, opposite end portions of the substrate protrude in a perpendicular direction from a bottom-portion side as seen from a center line in a longitudinal direction of the substrate, and the center of the shape protrudes upward. It is to be noted that the bent shape shown in FIG. 7 can be formed utilizing contraction in a step of sintering the respective piezoelectric/electrostrictive bodies 2, 3, and the W-shape shown in FIG. 8 can be formed by adjusting sintering contraction starting timings or sintering contraction amounts of the piezoelectric/electrostrictive bodies 2, 3 and the shape of the thin portion 1c.

In the piezoelectric/electrostrictive device of the present invention, the electrode is preferably electrically connected to the piezoelectric/electrostrictive body, and disposed between the respective piezoelectric/electrostrictive bodies. The electrode is preferably disposed over a region of the piezoelectric/electrostrictive body which substantially contributes to the flexural displacement or the like. For example, as shown in FIG. 3, the electrodes 4, 5, and 6 are preferably disposed in a region having 80% by area including the vicinity of the central portion of the surface on which the first and second piezoelectric/electrostrictive bodies 12 and 13 are formed.

Figure 5A:
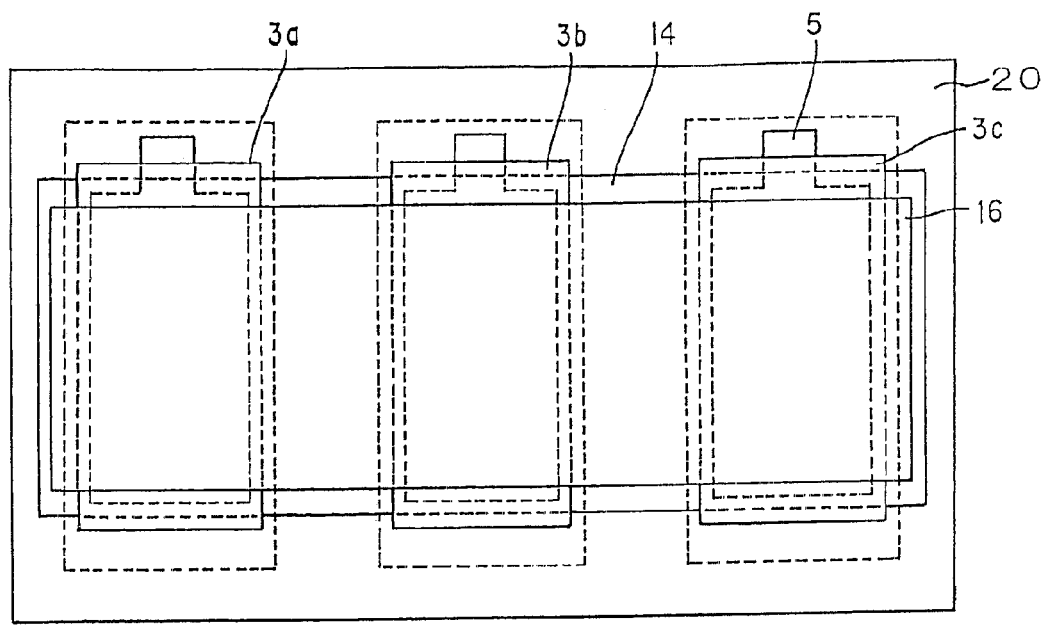
FIG. 5(a) is a top plan view schematically showing a further embodiment of the piezoelectric/electrostrictive device of the present invention.
Figure 5B:
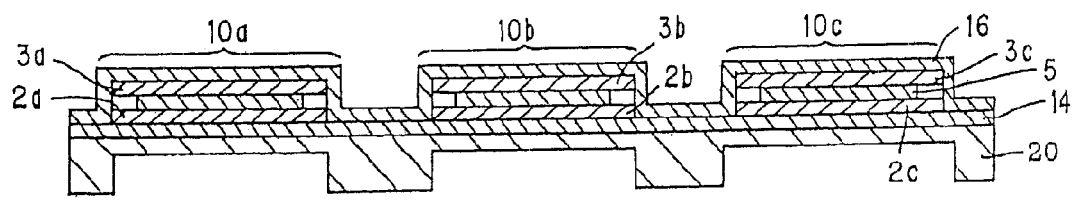
FIG. 5(b) is a sectional view schematically showing a still further embodiment of the piezoelectric/electrostrictive device of the present invention.

Moreover, when the common substrate 20 is shared by a plurality of piezoelectric/electrostrictive device units 10a to 10c as shown in FIGS. 5(a) and 5(b), a lowermost-layer electrode 14 and an uppermost-layer electrode 16 in the respective piezoelectric/electrostrictive device units 10a to 10c are shared among the respective piezoelectric/electrostrictive device units 10a to 10c. The integral electrode 14 may be disposed in a region corresponding to piezoelectric/electrostrictive portions 2a to 2c, 3a to 3c. Such an integral electrode does not have to be formed into a shape corresponding to each of the individual piezoelectric/electrostrictive bodies 2a to 2c, 3a to 3c, and positioning is facilitated in forming the electrode 14.

Figure 6:
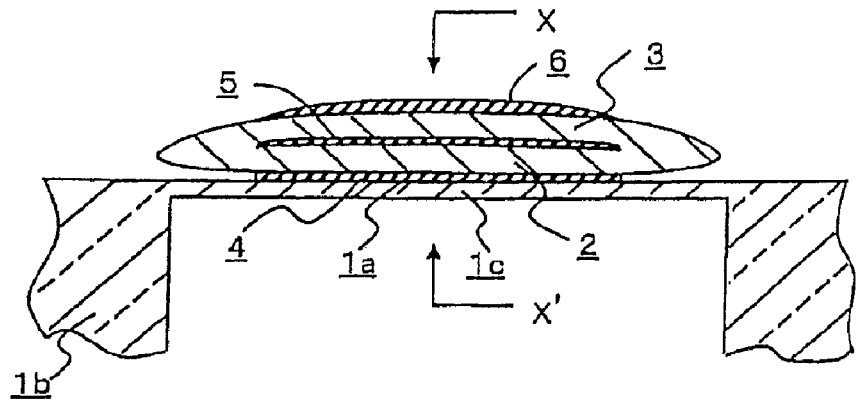
FIG. 6 is a sectional view showing one example of the embodiment shown in FIG. 3 in more detail.
Figure 9:
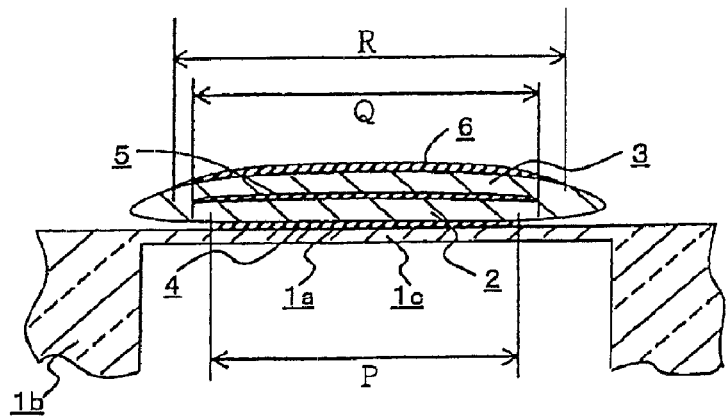
FIG. 9 is a sectional view showing a further example of the embodiment shown in FIG. 3 in more detail.
Figure 12A:
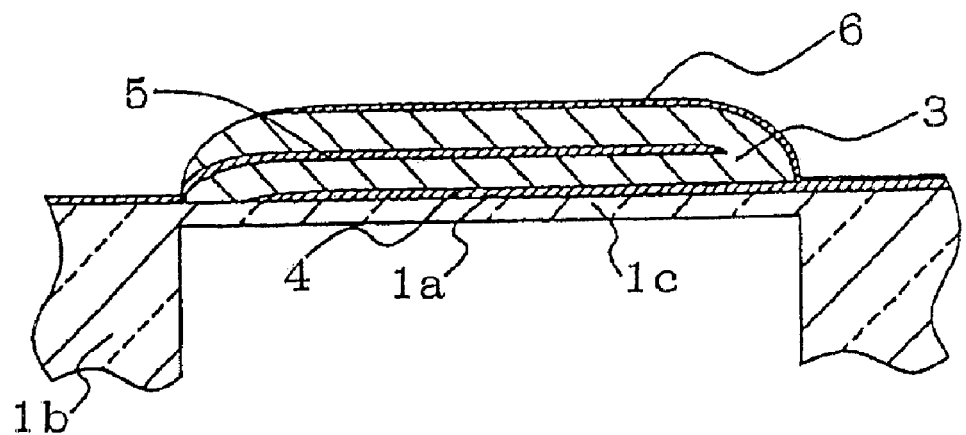
FIG. 12(a) is a sectional view along X-X' of the embodiment shown in FIG. 6.
Figure 12B:
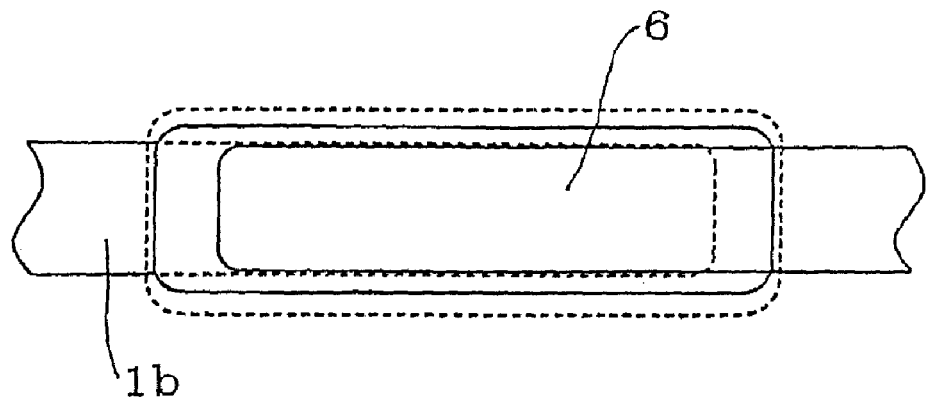
FIG. 12(b) is a top plan view of the embodiment shown in FIG. 6.

In the piezoelectric/electrostrictive device of the present invention, examples of suitable electrode materials include at least one kind of metal selected from the group consisting of Pt, Pd, Rh, Au, Ag, and an alloy of those metals. Above all, platinum or an alloy containing platinum as a major component is preferable because it has a high heat resistance during the sintering of the piezoelectric/electrostrictive body. An alloy such as Ag—Pd is preferably usable because the piezoelectric/electrostrictive body can be formed at a lower sintering temperature. There is not any special restriction on the dimension of the electrode. For example, as shown in FIGS. 6, 12(*a*), and 12(*b*), the respective electrodes 4, 5, and 6 may be set to an equal width, and the respective electrodes 4, 5, and 6 may be disposed in positions in corresponding to one another in width directions. As shown in FIG. 9, the respective electrodes 4, 5, and 6 are preferably successively arranged from the electrode 4 positioned in a lowermost-layer in a broader region including a region corresponding to the electrode positioned in a lower layer. According to such a constitution, since the piezoelectric/electrostrictive body positioned in an upper layer can be distorted to a greater degree than the piezoelectric/electrostrictive body positioned in the lower layer, a bending efficiency is enhanced, and the flexural displacement can be more effectively developed.

Figure 10:
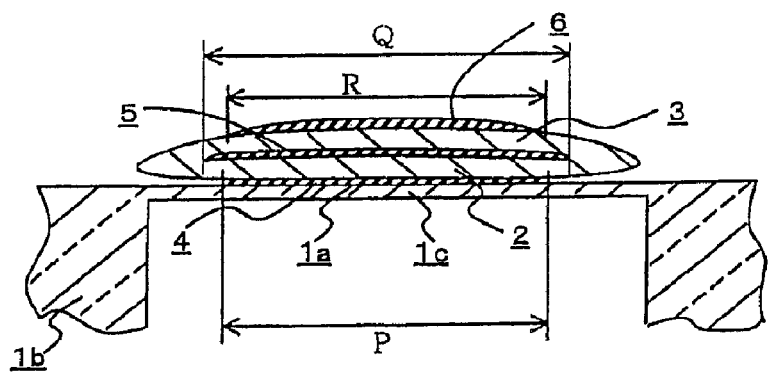
FIG. 10 is a sectional view showing a further example of the embodiment shown in FIG. 3 in more detail.
Figure 11:
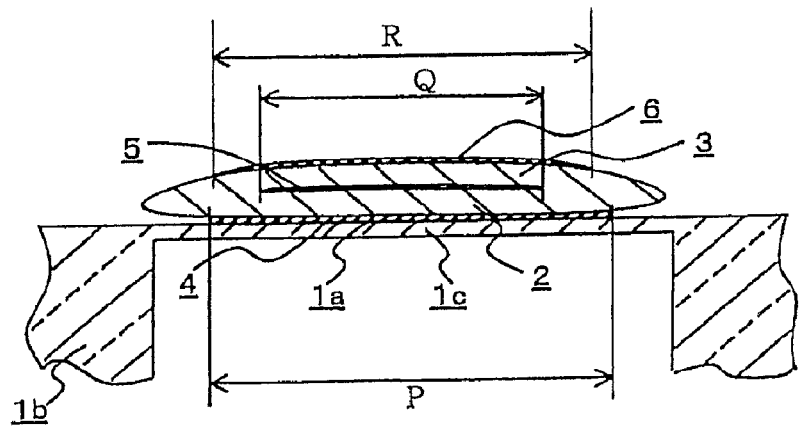
FIG. 11 is a sectional view showing a still further example of the embodiment shown in FIG. 3 in more detail.

However, in the case where the driving voltage of the piezoelectric/electrostrictive device is enhanced to obtain a larger flexural displacement, the intermediately positioned electrode 5 is preferably disposed in a region that is broader than that of each of the electrodes 4 and 6 positioned in the lower and upper layers, respectively, as shown in FIG. 10. Alternatively, as shown in FIG. 11, the intermediately positioned electrode 5 is preferably disposed in a region that is smaller than that of each of the electrodes 4 and 6. According to such a constitution, an electric field is hardly applied to the vicinity of each end portion (in a short direction) in which the thicknesses of the piezoelectric/electrostrictive bodies 2, 3 are easily reduced, and dielectric breakdown of the piezoelectric/electrostrictive bodies 2, 3 can be avoided.

In the case where a breadth difference is made in the region in which the electrode is disposed, the breadth difference is preferably optimized in consideration of the electric field distribution. For example, the electrodes 4 and 5 (or 5 and 6) are disposed adjacent to each other via the piezoelectric/electrostrictive body 2 (or 3), and a value of a ratio of the areas (areas of formed surfaces) in which the electrodes are disposed is preferably 0.5 to 2, more preferably 0.67 to 1.5, and especially preferably 0.83 to 1.2. It is to be noted that in FIGS. 9 to 11, the symbol P denotes a width of a lower electrode, Q denotes a width of an intermediate electrode, and R denotes a width of an upper electrode, respectively.

In the piezoelectric/electrostrictive device of the present embodiment, the thickness of the electrode is preferably 15 µm or less, more preferably 5 µm or less. When the thickness exceeds 15 µm, the electrode functions as a relaxing layer, and the flexural displacement is sometimes reduced. It is to be noted that the thickness of the electrode may be 0.05 µm or more from the viewpoint that a substantial function of the electrode is exhibited.

Next, there will be described a method of preparing the piezoelectric/electrostrictive porcelain composition according to the present invention. First, a method of preparing a piezoelectric/electrostrictive porcelain composition component contained in the piezoelectric/electrostrictive porcelain composition is described. To prepare the piezoelectric/electrostrictive porcelain composition component, first, raw materials such as an oxide of an element PbO, MgO, $Nb_2O_5$, $TiO_2$, $ZrO_2$, or NiO, and carbonate are weighed so as to obtain a desired composition, and they are mixed by a mixing method such as ball milling with some water to obtain a mixed slurry. Subsequently, the resultant slurry can be dried by using a drier or a filter to obtain a mixed raw material. When the resultant mixed raw material is calcined and ground, the piezoelectric/electrostrictive porcelain composition component (first particles) having desired particle diameters can be prepared. It is to be noted that the calcining may be performed at a temperature of 750 to 1300° C. The grinding may be performed by a method such as ball milling.

Next, a method of preparing the lead germanate contained in the piezoelectric/electrostrictive porcelain composition is described. To prepare the lead germanate, first, raw materials such as PbO and $GeO_2$ are weighed so as to obtain a desired composition, and they are mixed by a mixing method such as ball milling with some water to obtain a mixed slurry. Subsequently, the resultant mixed slurry can be dried by using a drier or the filter to obtain a mixed raw material. After the resultant mixed raw material is calcined at 500 to 900° C., it is ground by a method such as ball milling. Accordingly, lead germanate (second particles) having desired particle diameters can be prepared.

The prepared piezoelectric/electrostrictive porcelain composition component and lead germanate are weighed, respectively, to obtain a desired ratio, and mixed by a mixing method such as ball milling with some water to obtain a mixed slurry. The resultant mixed slurry can be dried by using a drier, a filter press or the like to prepare the piezoelectric/electrostrictive porcelain composition of the present embodiment. As to the prepared piezoelectric/electrostrictive porcelain composition, in a diffraction strength by an X-ray diffraction device, a ratio of the strength of the strongest diffraction line of a pyrochlore phase to that of the strongest diffraction line of a perovskite phase is preferably 5% or less, more preferably 2% or less.

Moreover, an average particle diameter of the piezoelectric/electrostrictive porcelain composition is preferably 0.07 to 1 µm, and more preferably 0.1 to 0.7 µm. It is to be noted that the particle diameter may be adjusted by thermally treating powder of the piezoelectric/electrostrictive porcelain composition at 400 to 750° C. In this case, finer particles are integrated with the other particles to constitute the powder having a uniform grain diameter, and it is preferably possible to form the piezoelectric/electrostrictive body having the uniform particle diameter. The piezoelectric/electrostrictive porcelain composition may be prepared by an alkoxide process, a coprecipitation process or the like.

Next, an embodiment of a first method of manufacturing a piezoelectric/electrostrictive device of the present invention is described. The first method of manufacturing the piezoelectric/electrostrictive device is a method of manufacturing a piezoelectric/electrostrictive device provided with a piezoelectric/electrostrictive body and an electrode electrically connected to the piezoelectric/electrostrictive body, comprising the steps of mixing and sintering first particles containing, as a major component, a piezoelectric/electrostrictive porcelain composition component including a $PbMg_{1/3}Nb_{2/3}O_3$—$PbZrO_3$—$PbTiO_3$ ternary solid solution system composition and NiO or including a $Pb(Mg, Ni)_{1/3}Nb_{2/3}O_3$—$PbZrO_3$—$PbTiO_3$ ternary solid solution system composition, and containing second particles formed of lead germanate to thereby form a piezoelectric/electrostrictive body.

In the first method of manufacturing the piezoelectric/electrostrictive device of the present invention, the first particles contain, as the main component, the piezoelectric/electrostrictive porcelain composition component including NiO or a predetermined ternary solid solution system composition containing an Ni element in a structure thereof. Therefore, it is possible to manufacture the piezoelectric/electrostrictive device having a piezoelectric/electrostrictive body in which a hetero-phase is inhibited from being formed and in which a ratio occupied by the perovskite phase contributing to an electric field induced strain is large and which has satisfactory piezoelectric/electrostrictive characteristics. Since the first particles are mixed with the second particles formed of lead germanate, the particles can be sintered at a lower temperature. Therefore, it is possible to manufacture the piezoelectric/electrostrictive device provided with the piezoelectric/electrostrictive body which is dense and superior in crystallinity without causing a composition deviation or the like.

In the first method of manufacturing the piezoelectric/electrostrictive device of the present embodiment, it is preferable to set an average particle diameter of the second particles to be smaller than that of the first particles. This is because it is possible to manufacture the piezoelectric/electrostrictive device provided with the piezoelectric/electrostrictive body in which evenness is not easily generated in a distribution of grain boundary phases containing lead germanate as a major component and which entirely exhibits uniform piezoelectric/electrostrictive characteristics.

Moreover, from the viewpoint of avoiding deviation in the distribution of the grain boundary phase and which exhibits entirely uniform piezoelectric/electrostrictive characteristics, the average particle diameter of the second particles is preferably 70% or less, more preferably 40% or less of that of the first particles.

In the first method of manufacturing the piezoelectric/electrostrictive device of the present invention, the first and second particles are preferably mixed and fired to thereby form the piezoelectric/electrostrictive body into a film shape and solidly attach the body onto the substrate made of a ceramic directly or via the film-like electrode. In this case, it is possible to manufacture a so-called piezoelectric/electrostrictive film type device in which the piezoelectric/electrostrictive body and the electrode have film-like shapes. It is to be noted that details of the method of manufacturing a piezoelectric/electrostrictive film type element will be described later.

Next, the second method of manufacturing a piezoelectric/electrostrictive device according to the present invention is described. The second method of manufacturing the piezoelectric/electrostrictive device of the present invention is a method of manufacturing a piezoelectric/electrostrictive device provided with a piezoelectric/electrostrictive body and an electrode electrically connected to the piezoelectric/electrostrictive body, comprising the steps of mixing first particles containing, as a major component, a piezoelectric/electrostrictive porcelain composition component containing a $PbMg_{1/3}Nb_{2/3}O_3$—$PbZrO_3$—$PbTiO_3$ ternary solid solution system composition and NiO, or a $Pb(Mg, Ni)_{1/3}Nb_{2/3}O_3$—$PbZrO_3$—$PbTiO_3$ ternary solid solution system composition, and second particles formed of lead germanate to obtain a mixture, calcining the resultant mixture at 550 to 900° C. to obtain a calcined body, grinding the resultant calcined body to obtain ground particles, and sintering the resultant ground particles to thereby form a piezoelectric/electrostrictive body.

Here, there will be generally described a method of preparing the piezoelectric/electrostrictive body having a portion which is not brought into contact with a grain boundary phase that contains lead germanate as the main component in an outer edge of piezoelectric/electrostrictive porcelain grains in an arbitrary cut section. To prepare such a piezoelectric/electrostrictive body, first, powder of the piezoelectric/electrostrictive porcelain composition component obtained by mixing, calcining, and grinding the raw materials is thermally treated at 1100° C. to 1300° C. Accordingly, grain growth and necking between the particles are caused to obtain a thermally treated material. Subsequently, this thermally treated material is pounded in a mortar to thereby obtain secondary particles connected to approximately several primary particles. According to the above-described method using the secondary particles (powder of the piezoelectric/electrostrictive porcelain composition component) obtained in this manner, and powder of lead germanate, it is possible to prepare a piezoelectric/electrostrictive body having the portion which is not brought into contact with the grain boundary phase in the outer edge of the piezoelectric/electrostrictive porcelain grain in the arbitrary cut section.

The powder of the piezoelectric/electrostrictive porcelain composition component obtained by calcining and grinding still has a low crystallinity, and the piezoelectric/electrostrictive characteristics of the powder are low. Therefore, in the case where the powder of the piezoelectric/electrostrictive porcelain composition component is thermally treated at a temperature (e.g., 1100 to 1300° C.) that is higher than the calcining temperature to enhance the crystallinity, even when the powder is sintered at a low temperature, it is possible to obtain a piezoelectric/electrostrictive device provided with a piezoelectric/electrostrictive body having high piezoelectric/electrostrictive characteristics. It is to be noted that when the thermally treated material is ground too finely, a remaining stress layer is generated on the surfaces of the resultant secondary particles by stress during the grinding, and the crystallinity is sometimes deteriorated. Therefore, the powder is prevented from being ground excessively, and as a result, a necking portion is preferably left. Instead of leaving the necking portion or grinding grain grown primary particles, a contact area between the piezoelectric/electrostrictive porcelain particles due to lead germanate may be reduced, or an amount of lead germanate for use may be reduced to prevent deteriorations of piezoelectric/electrostrictive characteristics of the resultant piezoelectric/electrostrictive body or device.

In the second method of manufacturing the piezoelectric/electrostrictive device of the present invention, the predetermined particles are used which contain, as the main component, the piezoelectric/electrostrictive porcelain composition component including NiO or a predetermined ternary solid solution system composition containing an Ni element in a structure thereof. Therefore, it is possible to manufacture a piezoelectric/electrostrictive device having a piezoelectric/electrostrictive body in which a hetero-phase is inhibited from being formed and in which a ratio occupied by the perovskite phase contributing to an electric field induced distortion is large and which has satisfactory piezoelectric/electrostrictive characteristics. In the second method of manufacturing the piezoelectric/electrostrictive device of the present invention, the ground particles for use are preferably piezoelectric/electrostrictive composition particles containing the piezoelectric/electrostrictive porcelain composition component as the main component and 30% or more by mass of coated particles at least a part of whose outer peripheral surface is coated with lead germanate. By using piezoelectric/electrostrictive porcelain particles having such composition and structural characteristics, the particles can be sintered at a lower temperature. It is possible to manufacture a piezoelectric/electrostrictive device provided with a piezoelectric/electrostrictive body which is dense and superior in crystallinity without causing deviation of the composition. It is to be noted that a ratio of the coated particles occupying the piezoelectric/electrostrictive porcelain composition particles (ground particles) for use is preferably 50% by mass or more, more preferably 70% by mass or more, and especially preferably 100% by mass.

The piezoelectric/electrostrictive porcelain composition particles whose content of coated particles is 30% by mass or more can be prepared by grinding the piezoelectric/electrostrictive body prepared by the method described above in the method of manufacturing the piezoelectric/electrostrictive body. When coated particles are used, it is possible to manufacture a piezoelectric/electrostrictive device provided with a piezoelectric/electrostrictive body in which unevenness is not easily generated in the distribution of the grain boundary phase containing lead germanate as the main component and which exhibits entirely uniform piezoelectric/electrostrictive characteristics.

After sintering, polarization treatment is performed using appropriate conditions. In the polarization treatment, heating is preferably performed by a known technology. The heating temperature depends on the Curie point of the piezoelectric/electrostrictive porcelain, and is preferably set at 40 to 200° C.

Moreover, to form the overall shape of the piezoelectric/electrostrictive body into a sheet shape, after adding a plasticizer, a dispersant, a solvent or the like to the piezoelectric/electrostrictive porcelain composition, and forming the composition into a slurry using a general mixing device such as a ball mill, the slurry can be molded into a sheet shape by use of a general sheet molding machine such as a doctor blade.

Next, a specific mode of a method of manufacturing a piezoelectric/electrostrictive device (piezoelectric/electrostrictive film type device) is described in which the piezoelectric/electrostrictive body and the electrode have film-like shapes. First, a layer formed of a piezoelectric/electrostrictive porcelain composition is formed on a substrate made of a ceramic or the electrode formed on the surface of the substrate. Examples of a method of forming the electrode include ion beam, sputtering, vacuum evaporation, PVD, ion plating, CVD, plating, aerosol deposition, screen printing, spraying, and dipping. Above all, sputtering or screen printing are preferable with respect to bonding the substrate and the piezoelectric/electrostrictive body. As to the formed electrode, an appropriate temperature is selected depending on the material or forming method of the electrode, and the electrode can be formed integrally with the substrate and/or the piezoelectric/electrostrictive body by the thermal treatment at about 500 to 1400° C. This thermal treatment may be performed every time the electrode is formed, but may be performed together during the sintering of a layer formed of the piezoelectric/electrostrictive porcelain composition. However, after forming the layer formed of the piezoelectric/electrostrictive porcelain composition, the thermal treatment is not performed at a temperature which exceeds a sintering temperature of the layer formed of the piezoelectric/electrostrictive porcelain composition.

Examples of a method of forming the layer formed of the piezoelectric/electrostrictive porcelain composition on the substrate include ion beam, sputtering, vacuum evaporation, PVD, ion plating, CVD, plating, sol-gel, aerosol deposition, screen printing, spraying, and dipping. Above all, screen printing is preferable because it is possible to easily and continuously form the layer into a high-precision shape and thickness. It is to be noted that to prepare a piezoelectric/electrostrictive film type device that is provided with a plurality of piezoelectric/electrostrictive bodies and electrodes that are alternately sandwiched and laminated, the electrode is formed on the layer formed of the piezoelectric/electrostrictive porcelain composition formed on the substrate by a method similar to the above-described method. It is to be noted that on this electrode, the layers formed of the piezoelectric/electrostrictive porcelain compositions, and the electrodes are alternately and repeatedly formed until desired multiple layers are obtained.

Thereafter, a laminate obtained by alternately laminating the layers formed of the piezoelectric/electrostrictive porcelain compositions and the electrodes on the substrate is integrally sintered. According to the sintering, the film-like piezoelectric/electrostrictive body can be solidly attached onto the substrate directly or via the film-like electrode. It is to be noted that the sintering does not necessarily have to be integrally performed, and may be successively performed every time one layer formed of the piezoelectric/electrostrictive porcelain composition is formed, but it is preferable to integrally sinter the laminate including the electrodes from the viewpoint of production efficiency.

In this case, the sintering temperature is preferably 800 to 1250° C., more preferably 900 to 1200° C. When the temperature is less than 800° C., the substrate or the electrode is incompletely solidly attached to the piezoelectric/electrostrictive body, and density of the piezoelectric/electrostrictive body becomes insufficient in some cases. When the temperature exceeds 1250° C., excessive reactions occur between the piezoelectric/electrostrictive porcelain composition containing the $PbMg_{1/3}Nb_{2/3}O_3$—$PbZrO_3$—$PbTiO_3$ ternary solid solution system composition and NiO or the $Pb(Mg, Ni)_{1/3}Nb_{2/3}O_3$—$PbZrO_3$—$PbTiO_3$ ternary solid solution system composition and lead germanate, and the piezoelectric/electrostrictive characteristics of the resultant piezoelectric/electrostrictive body are sometimes deteriorated. The maximum temperature holding time during sintering is preferably one minute or more and ten hours or less, more preferably five minutes and four hours or less. When the maximum temperature holding time is less than one minute, the piezoelectric/electrostrictive body is easily insufficiently densified, and desired characteristics cannot be obtained in some cases. When the maximum temperature holding time exceeds ten hours, a disadvantage sometimes occurs in that the piezoelectric/electrostrictive characteristics are deteriorated.

Thereafter, a polarization treatment is performed using appropriate conditions. In the polarization treatment, heating is preferably performed by a known technology. The heating temperature depends on the Curie point of a piezoelectric/electrostrictive porcelain, and is preferably set at 40 to 200° C.

EXAMPLES

The present invention will be specifically described hereinafter based on examples, but the present invention is not limited to these examples. There will be described hereinafter methods of measuring various physical values.

Bulk Density: The bulk density was measured with respect to a sintered body (piezoelectric/electrostrictive body) by the Archimedes process.

Electric Field Induced Strain: A strain gauge was attached onto an electrode, and the amount of strain in a direction perpendicular to an electric field in a case where a voltage of 3 kV/mm was applied was measured as an electric field induced strain (ppm).

$d_{31}$ Constant: This constant was measured according to Japan Electronic Material Industrial Association standard "Piezoelectric Ceramic Vibrator Electric Test Method EMAS-6100".

Durability: The ratio of the polarization value remaining after the test with respect to the polarization value before the test was measured as durability in a case where an electric field of 3 kV/mm was applied to a piezoelectric/electrostrictive body by means of an alternate current $10^9$ times.

Flexural Displacement: A voltage was applied between the electrodes of a piezoelectric/electrostrictive film type device so as to obtain an electric field of 3 kV/mm, and a generated flexural displacement (μm) was measured with a laser displacement measurement unit.

Electric Field Induced Strain Fluctuation: Electric field induced strains of 20 samples were measured, and the difference between a maximum value and a minimum value of the measured electric field induced strains was obtained as an "electric field induced strain fluctuation."

Example 1

Raw materials such as an oxide of PbO, MgO, $Nb_2O_5$, $TiO_2$, $ZrO_2$, or NiO were weighed and mixed so as to obtain a desired composition ratio, and a mixed raw material was prepared. After the mixed raw material was calcined at 1000° C., the material was ground by a ball mill, and the first particles were prepared which contained as a major component a piezoelectric/electrostrictive porcelain composition component including: a $PbMg_{1/3}Nb_{2/3}O_3$—$PbZrO_3$—$PbTiO_3$ ternary solid solution system composition having a composition ratio of 20:43:37 (mass ratio); and 0.5% by mass of NiO.

Next, raw materials such as PbO and $GeO_2$ were weighed and mixed so as to obtain a predetermined composition ratio, and the mixed raw material was prepared. After calcining this mixed raw material at 600° C., the material was ground in a ball mill to prepare the second particles formed of lead germanate (hereinafter referred to simply as "PGO") whose composition was represented by $PbGeO_3$. The first and second particles were weighed and mixed so that the PGO content was 0.5% by mass, and a mixed slurry was obtained. The resultant mixed slurry was dried using a drier to obtain a powder of the piezoelectric/electrostrictive porcelain composition. The resultant powder of the piezoelectric/electrostrictive porcelain composition was compressed and molded into a green compact having a diameter of 20 mm×thickness of 6 mm under a pressure of 0.5 t/cm². The resultant green compact was stored in a magnesia container, and sintered at 1050° C. for three hours to obtain a sintered body (piezoelectric/electrostrictive body). The resultant sintered body was formed into a size of 12 mm×3 mm×1 mm, opposite surfaces of the body were coated with a silver paste to bake, the body was baked to obtain an electrode, and the electrode was immersed into silicon oil at 70° C. Moreover, a direct-current voltage of 3 kV/mm was applied between the electrodes for 15 minutes to thereby perform polarization, and the piezoelectric/electrostrictive device (Example 1) was obtained. The measurement results of the physical values of the resultant piezoelectric/electrostrictive device are shown in Table 1.

Comparative Examples 1 and 2

Piezoelectric/electrostrictive devices (Comparative Examples 1, 2) were obtained in the same manner as in Example 1 described above except that the second particles were not used, and the sintering temperature was set at a temperature as shown in Table 1. The measurement results of the physical values of the resultant piezoelectric/electrostrictive devices are shown in Table 1.

From the results shown in Table 1, it is apparent that in the case where the piezoelectric/electrostrictive porcelain composition containing a predetermined amount of PGO is used, even when the composition is sintered at a low temperature of 1050° C., it is possible to manufacture a piezoelectric/electrostrictive device provided with a dense piezoelectric/electrostrictive body having the same piezoelectric/electrostrictive characteristics as those at a time when the composition is sintered at a high temperature of 1250° C. without containing PGO.

Example 2

Raw materials such as an oxide of an element PbO, MgO, $Nb_2O_5$, $TiO_2$, $ZrO_2$, or NiO were weighed and mixed so as to obtain a predetermined composition ratio. After this mixed raw material was calcined at 1000° C., the material was ground by a ball mill, and first particles were prepared which contained as a major component a piezoelectric/electrostrictive porcelain composition component including: a $Pb(Mg, Ni)_{1/3}Nb_{2/3}O_3$—$PbZrO_3$—$PbTiO_3$ ternary solid solution system composition having a composition ratio of 20:43:37 (mass ratio) and a ratio of Mg and Ni of 87:13 (mass ratio). A piezoelectric/electrostrictive device (Example 2) was obtained in the same manner as in Example 1 described above except that the prepared first particles of Example 2 were used. The measurement results of the physical values of the resultant piezoelectric/electrostrictive device are shown in Table 2.

Comparative Examples 3 and 4

Piezoelectric/electrostrictive devices (Comparative Examples 3, 4) were obtained in the same manner as in Example 2 described above except that second particles were not used, and the sintering temperature was set as shown in Table 2. The measurement results of the physical values of the resultant piezoelectric/electrostrictive devices are shown in Table 2.

TABLE 1

| | Composition ratio (mass ratio) of ternary solid solution system composition | | | NiO content ratio | PGO | PGO content ratio | Sintering temperature | Bulk density | Electric field induced strain | $d_{31}$ constant |
|---|---|---|---|---|---|---|---|---|---|---|
| | PMN | PZ | PT | (mass %) | kind | (mass %) | (° C.) | (g/cm³) | (ppm) | (×10⁻¹² m/V) |
| Example 1 | 20 | 43 | 37 | 0.5 | $PbGeO_3$ | 0.5 | 1050 | 7.7 | 560 | −90 |
| Comparative Example 1 | 20 | 43 | 37 | 0.5 | None | None | 1050 | 5.3 | Non-measurable | Non-measurable |
| Comparative Example 2 | 20 | 43 | 37 | 0.5 | None | None | 1250 | 7.8 | 560 | −98 |

TABLE 2

| | Composition ratio (mass ratio) of ternary solid solution system composition | | | Mg:Ni ratio (mass ratio) | PGO kind | PGO content ratio (mass %) | Sintering temperature (°C.) | Bulk density (g/cm$^3$) | Electric field induced strain (ppm) | $d_{31}$ constant (×10$^{-12}$m/V) |
|---|---|---|---|---|---|---|---|---|---|---|
| | PMN | PZ | PT | | | | | | | |
| Example 2 | 20 | 43 | 37 | 87:13 | PbGeO$_3$ | 0.5 | 1050 | 7.8 | 830 | −163 |
| Comparative Example 3 | 20 | 43 | 37 | 87:13 | None | None | 1050 | 6.6 | 340 | −105 |
| Comparative Example 4 | 20 | 43 | 37 | 87:13 | None | None | 1250 | 7.8 | 890 | −169 |

From the results shown in Table 2, it is apparent that in the case where the piezoelectric/electrostrictive porcelain composition containing a predetermined amount of PGO is used, even when the composition is sintered at a low temperature of 1050° C., it is possible to manufacture a piezoelectric/electrostrictive device provided with a dense piezoelectric/electrostrictive body having the same piezoelectric/electrostrictive characteristics as those at a time when the composition is sintered at a high temperature of 1250° C. without containing PGO.

Examples 3 to 6

Piezoelectric/electrostrictive devices (Examples 3 to 6) were obtained in the same manner as in Example 1 described above except that the Pb in the piezoelectric/electrostrictive porcelain composition component was replaced with a certain kind of replacement element (Sr, Ba, La, or Bi) so as to obtain the replacement ratios shown in Table 3. The measurement results of the physical values of the resultant piezoelectric/electrostrictive devices are shown in Table 3.

From the results shown in Table 3, it is apparent that in the case where Pb is replaced with a predetermined replacement element, it is possible to manufacture a piezoelectric/electrostrictive device provided with a piezoelectric/electrostrictive body having a higher $d_{31}$ constant.

Examples 7 to 11

Piezoelectric/electrostrictive devices (Examples 7 to 11) were obtained in the same manner as in Example 2 described above, except that the Ti in the piezoelectric/electrostrictive porcelain composition component was replaced with a certain type of replacement element (Nb, Ta, W, or Mo) so as to obtain the replacement ratios shown in Table 4. The measurement results of the physical values of the resultant piezoelectric/electrostrictive devices are shown in Table 4.

TABLE 3

| | Composition ratio (mass ratio) of ternary solid solution composition | | | NiO content ratio (mass %) | PGO kind | PGO content ratio (mass %) | Replacing element | Replacement ratio (mol %) | Bulk density (g/cm$^3$) | Electric field induced strain (ppm) | $d_{31}$ constant (×10$^{-12}$m/V) |
|---|---|---|---|---|---|---|---|---|---|---|---|
| | PMN | PZ | PT | | | | | | | | |
| Example 3 | 20 | 43 | 37 | 0.5 | PbGeO$_3$ | 0.5 | Sr | 5 | 7.7 | 540 | −105 |
| Example 4 | 20 | 43 | 37 | 0.5 | PbGeO$_3$ | 0.5 | Ba | 5 | 7.7 | 520 | −97 |
| Example 5 | 20 | 43 | 37 | 0.5 | PbGeO$_3$ | 0.5 | La | 0.5 | 7.7 | 530 | −103 |
| Example 6 | 20 | 43 | 37 | 0.5 | PbGeO$_3$ | 0.5 | Bi | 0.5 | 7.7 | 530 | −103 |

TABLE 4

| | Composition ratio (mass ratio) of ternary solid solution composition | | | Mg:Ni ratio (mass ratio) | PGO kind | PGO content ratio (mass %) | Replacing element | Replacement ratio (mol %) | Bulk density (g/cm$^3$) | Durability (%) |
|---|---|---|---|---|---|---|---|---|---|---|
| | PMN | PZ | PT | | | | | | | |
| Example 7 | 20 | 43 | 37 | 87:13 | PbGeO$_3$ | 0.5 | None | — | | 70 |
| Example 8 | 20 | 43 | 37 | 87:13 | PbGeO$_3$ | 0.5 | Nb | 5 | 7.8 | 85 |
| Example 9 | 20 | 43 | 37 | 87:13 | PbGeO$_3$ | 0.5 | Ta | 5 | 7.8 | 80 |

TABLE 4-continued

| | Composition ratio (mass ratio) of ternary solid solution system composition | | | Mg:Ni ratio (mass ratio) | PGO kind | PGO content ratio (mass %) | Replacing element | Replacement ratio (mol %) | Bulk density (g/cm³) | Durability (%) |
|---|---|---|---|---|---|---|---|---|---|---|
| | PMN | PZ | PT | | | | | | | |
| Example 10 | 20 | 43 | 37 | 87:13 | PbGeO₃ | 0.5 | W | 5 | 7.7 | 77 |
| Example 11 | 20 | 43 | 37 | 87:13 | PbGeO₃ | 0.5 | Mo | 5 | 7.8 | 78 |

From the results shown in Table 4, it is apparent that in the case where Ti is replaced with a predetermined replacing element, it is possible to manufacture a piezoelectric/electrostrictive device provided with a piezoelectric/electrostrictive body having higher durability.

Examples 12 to 14

Piezoelectric/electrostrictive devices (Examples 12 to 14) were obtained in the same manner as in Example 1 described above, except that the certain kind of compound ($MnO_2$, $CeO_2$, or $SiO_2$) was included so as to obtain the content ratios shown in Table 5. The measurement results of the physical values of the resultant piezoelectric/electrostrictive devices are shown in Table 5.

From the results shown in Table 5, it is apparent that in the case where a predetermined content compound is contained, it is possible to manufacture a piezoelectric/electrostrictive device provided with a piezoelectric/electrostrictive body having higher piezoelectric/electrostrictive characteristics.

Examples 15 to 17

Piezoelectric/electrostrictive devices (Examples 15 to 17) were obtained in the same manner as in Example 2 described above, except that a certain content compound ($MnO_2$, $CeO_2$, or $SiO_2$) was included so as to obtain the content ratios shown in Table 6. The measurement results of the physical values of the resultant piezoelectric/electrostrictive devices are shown in Table 6.

TABLE 5

| | Composition ratio (mass ratio) of ternary solid solution system composition | | | NiO content ratio | PGO kind | PGO content ratio | Content compound | Content ratio | Bulk density | Electric field induced strain | $d_{31}$ constant |
|---|---|---|---|---|---|---|---|---|---|---|---|
| | PMN | PZ | PT | (mass %) | | (mass %) | | (mass %) | (g/cm³) | (ppm) | (×10⁻¹² m/V) |
| Example 12 | 20 | 43 | 37 | 0.5 | PbGeO₃ | 0.5 | MnO₂ | 0.2 | 7.7 | 520 | −86 |
| Example 13 | 20 | 43 | 37 | 0.5 | PbGeO₃ | 0.5 | CeO₂ | 0.2 | 7.6 | 560 | −92 |
| Example 14 | 20 | 43 | 37 | 0.5 | PbGeO₃ | 0.5 | SiO₂ | 0.2 | 7.5 | 500 | −80 |

TABLE 6

| | Composition ratio (mass ratio) of ternary solid solution system composition | | | Mg:Ni ratio (mass ratio) | PGO kind | PGO content ratio (mass %) | Content compound | Content ratio (mass %) | Bulk density (g/cm³) | Electric field induced strain (ppm) | $d_{31}$ constant (×10⁻¹² m/V) |
|---|---|---|---|---|---|---|---|---|---|---|---|
| | PMN | PZ | PT | | | | | | | | |
| Example 15 | 20 | 43 | 37 | 87:13 | PbGeO₃ | 0.5 | MnO₂ | 0.2 | 7.8 | 760 | −152 |
| Example 16 | 20 | 43 | 37 | 87:13 | PbGeO₃ | 0.5 | CeO₂ | 0.2 | 7.6 | 800 | −158 |
| Example 17 | 20 | 43 | 37 | 87:13 | PbGeO₃ | 0.5 | SiO₂ | 0.2 | 7.6 | 730 | −146 |

From the results shown in Table 6, it is apparent that in the case where a predetermined content compound is contained, it is possible to manufacture a piezoelectric/electrostrictive device provided with a piezoelectric/electrostrictive body having higher piezoelectric/electrostrictive characteristics.

Examples 18 to 22, Comparative Example 5

Piezoelectric/electrostrictive devices (Examples 18 to 22, Comparative Example 5) were obtained in the same manner as in Example 2 described above, except that PGO was contained so as to obtain the content ratios shown in Table 7 (with the proviso that PGO was not contained in Comparative Example 5). The measurement results of the physical values of the resultant piezoelectric/electrostrictive devices are shown in Table 7.

TABLE 7

| | Composition ratio (mass ratio) of ternary solid solution system composition | | | Mg:Ni ratio (mass ratio) | PGO kind | PGO content ratio (mass %) | Bulk density (g/cm³) | Electric field induced strain (ppm) |
|---|---|---|---|---|---|---|---|---|
| | PMN | PZ | PT | | | | | |
| Comparative Example 5 | 20 | 43 | 37 | 87:13 | None | None | 6.6 | 340 |
| Example 18 | 20 | 43 | 37 | 87:13 | PbGeO₃ | 0.3 | 7.8 | 800 |
| Example 19 | 20 | 43 | 37 | 87:13 | PbGeO₃ | 1.8 | 7.8 | 720 |
| Example 20 | 20 | 43 | 37 | 87:13 | PbGeO₃ | 3 | 7.8 | 620 |
| Example 21 | 20 | 43 | 37 | 87:13 | PbGeO₃ | 4 | 7.8 | 540 |
| Example 22 | 20 | 43 | 37 | 87:13 | PbGeO₃ | 6 | 7.8 | 490 |

From the results shown in Table 7, it is apparent that in the case where a PGO content ratio is set within a predetermined range, typically 0.3 to 4% by mass, preferably 0.3 to 3% by mass, and more preferably 0.3 to 1.8 by mass, it is possible to manufacture a piezoelectric/electrostrictive device provided with a piezoelectric/electrostrictive body having higher piezoelectric/electrostrictive characteristics.

Examples 23 to 27

Piezoelectric/electrostrictive devices (Examples 23 to 27) were obtained in the same manner as in Example 2 described above, except that certain kinds of PGO were contained so as to obtain content ratios shown in Table 8. The measurement results of the physical values of the resultant piezoelectric/electrostrictive devices are shown in Table 8.

From the results shown in Table 8, it is apparent that in the case where any of the above-described kinds of PGO is contained, it is possible to manufacture a piezoelectric/electrostrictive device provided with a piezoelectric/electrostrictive body having higher piezoelectric/electrostrictive characteristics.

Example 28

A lower electrode (dimension: 1.2×0.8 mm, thickness: 3 μm) made of 70Ag-30Pd was formed by a screen printing process on a substrate (dimension of thin portion: 1.6×1.1 mm, thickness: 10 μm) made of $Y_2O_3$ stabilized zirconia whose thin portion was flat. The electrode was thermally treated at 1100° C. for two hours, and formed integrally with the substrate. Subsequently, a piezoelectric/electrostrictive porcelain composition was obtained in the same manner as in Example 2 described above, except that the PGO content ratio was set to 1% by mass, and laminated on the electrode by screen printing to obtain a laminate having the dimensions of 1.3×0.9 mm and a thickness of 15 μm. This laminate was placed in a container and thermally treated at 1050° C. for two hours. Next, after forming an upper electrode (dimension: 1.2×0.8 mm, thickness: 0.5 μm) made of Au on an uppermost portion of the laminate by screen printing, thermal treatment was performed to manufacture a piezoelectric/electrostrictive device (Example 28). The measurement result of the flexural displacement of the manufactured piezoelectric/electrostrictive device is shown in Table 9.

TABLE 8

| | Composition ratio (mass ratio) of ternary solid solution system composition | | | Mg:Ni ratio (mass ratio) | PGO kind | PGO content ratio (mass %) | Bulk density (g/cm³) | Electric field induced strain (ppm) | $d_{31}$ constant (×10⁻¹² m/V) |
|---|---|---|---|---|---|---|---|---|---|
| | PMN | PZ | PT | | | | | | |
| Example 23 | 20 | 43 | 37 | 87:13 | PbGeO₃ | 0.5 | 7.8 | 830 | −163 |
| Example 24 | 20 | 43 | 37 | 87:13 | Pb₅Ge₃O₁₁ | 0.5 | 7.9 | 870 | −179 |
| Example 25 | 20 | 43 | 37 | 87:13 | Pb₃GeO₅ | 0.5 | 7.8 | 840 | −169 |
| Example 26 | 20 | 43 | 37 | 87:13 | Eutectic crystal of PbGeO₃ and Pb₅Ge₃O₁₁ | 0.5 | 7.8 | 820 | −160 |
| Example 27 | 20 | 43 | 37 | 87:13 | Eutectic crystal of Pb₅Ge₃O₁₁ and Pb₃GeO₅ | 0.5 | 7.9 | 850 | −183 |

Comparative Example 6

A piezoelectric/electrostrictive film type device (Comparative Example 6) was obtained in the same manner as in Example 3 described above, except that the piezoelectric/electrostrictive porcelain composition did not contain PGO. The measurement result of the flexural displacement of the manufactured piezoelectric/electrostrictive film type device is shown in Table 9.

TABLE 9

| | Composition ratio (mass ratio) of ternary solid solution system composition | | | Mg:Ni ratio (mass ratio) | PGO kind | PGO content ratio (mass %) | Flexural displacement (μm) |
|---|---|---|---|---|---|---|---|
| | PMN | PZ | PT | | | | |
| Example 28 | 20 | 43 | 37 | 87:13 | PbGeO$_3$ | 1 | 1.3 |
| Comparative Example 6 | 20 | 43 | 37 | 87:13 | None | None | —*[1] |

*[1] not densified, short-circuit defect generated between upper and lower electrodes From the results shown in Table 9, it is apparent that in the case where the piezoelectric/electrostrictive porcelain composition containing a predetermined amount of PGO is used, even when the composition is sintered at a low temperature of 1050° C., it is possible to form a denser piezoelectric/electrostrictive body and manufacture a piezoelectric/electrostrictive device capable of obtaining a higher displacement.

Examples 29 to 31

There were prepared particles formed of a piezoelectric/electrostrictive porcelain composition having a value of coating ratio (PGO coating ratio) with PGO on an outer peripheral surface as shown in Table 10 and containing as a major component a piezoelectric/electrostrictive porcelain composition component including a Pb(Mg, Ni)$_{1/3}$Nb$_{2/3}$O$_3$—PbZrO$_3$—PbTiO$_3$ ternary solid solution system composition having an Ni replacement ratio of 13 mol %. These particles were compressed and molded into a having a diameter of 20 mm×thickness 6 mm under a pressure of 0.5 t/cm². The resultant molded green compact was stored in a magnesia container and sintered at 1050° C. for three hours to obtain a sintered body (piezoelectric/electrostrictive body. Next, after forming the resultant sintered body into a size of 12 mm×3 mm×1 mm, electrodes were formed on opposite surfaces of the body by gold sputtering, and immersed into silicon oil at 70° C. Moreover, a direct-current voltage of 3 kV/mm was applied between the electrodes for 15 minutes to perform polarization, and piezoelectric/electrostrictive devices (Examples 29 to 31) were obtained. The measurement results of the electric field induced strain fluctuations of the resultant piezoelectric/electrostrictive devices are shown in Table 10.

TABLE 10

| | Composition ratio (mass ratio) of ternary solid solution system composition | | | Mg:Ni ratio (mass ratio) | PGO kind | PGO content ratio (mass %) | PGO coating ratio (%) | Electric field induced strain fluctuation (ppm) |
|---|---|---|---|---|---|---|---|---|
| | PMN | PZ | PT | | | | | |
| Example 29 | 20 | 43 | 37 | 87:13 | PbGeO$_3$ | 1 | 0 | 50 |
| Example 30 | 20 | 43 | 37 | 87:13 | PbGeO$_3$ | 1 | 40 | 50 |
| Example 31 | 20 | 43 | 37 | 87:13 | PbGeO$_3$ | 1 | 80 | 30 |

From the results shown in Table 10, it is apparent that in the case where the particles having a large PGO coating ratio and formed of the piezoelectric/electrostrictive porcelain composition are used, it is possible to manufacture a piezoelectric/electrostrictive device provided with the piezoelectric/electrostrictive body having small electric field induced strain fluctuations.

Examples 32 to 35

There were prepared first particles in the same manner as in Example 2 described above, which contained as a major component a piezoelectric/electrostrictive porcelain composition component including a Pb (Mg, Ni)$_{1/3}$Nb$_{2/3}$O$_3$—PbZrO$_3$—PbTiO$_3$ ternary solid solution system composition having an Ni replacement ratio of 13 mol %. Piezoelectric/electrostrictive devices (Examples 32 to 35) were obtained in the same manner as in Example 1 described above, except that the above particles were used, second particles prepared in the same manner as in Example 1 and formed of PGO having certain particle diameters were also used, and the particles were weighed and mixed so as to obtain a ratio (second/first (%)) of particle diameters of the second particles with respect to those of the first particles as shown in Table 11. The measurement results of the electric field induced strain fluctuations of the resultant piezoelectric/electrostrictive devices are shown in Table 11.

TABLE 11

| | Composition ratio (mass ratio) of ternary solid solution system composition | | | Mg:Ni ratio (mass ratio) | PGO kind | PGO content ratio (mass %) | Particle diameter ratio (first/second) (%) | Electric field induced strain fluctuation (ppm) |
|---|---|---|---|---|---|---|---|---|
| | PMN | PZ | PT | | | | | |
| Example 32 | 20 | 43 | 37 | 87:13 | $PbGeO_3$ | 1 | 110 | 110 |
| Example 33 | 20 | 43 | 37 | 87:13 | $PbGeO_3$ | 1 | 80 | 80 |
| Example 34 | 20 | 43 | 37 | 87:13 | $PbGeO_3$ | 1 | 50 | 50 |
| Example 35 | 20 | 43 | 37 | 87:13 | $PbGeO_3$ | 1 | 30 | 20 |

From the results shown in Table 11, it is apparent that it is possible to manufacture a piezoelectric/electrostrictive device provided with a piezoelectric/electrostrictive body having a smaller electric field induced strain fluctuation in a case where the ratio (first/second (%)) of the particle diameters of the first particles with respect to those of the second particles is smaller.

According to the present invention, a piezoelectric/electrostrictive device is provided which has superior piezoelectric/electrostrictive characteristics, and which is suitable for an actuator, a sensor or the like.

We claim:

1. A method of manufacturing a piezoelectric/electrostrictive device having a piezoelectric/electrostrictive body and an electrode electrically connected to the piezoelectric/electrostrictive body, the method comprising the steps of:

mixing and sintering first particles containing, as a major component, a piezoelectric/electrostrictive porcelain composition component including a $PbMg_{1/3}Nb_{2/3}O_3$—$PbZrO_3$—$PbTiO_3$ ternary solid solution system composition and NiO or including a $Pb(Mg, Ni)_{1/3}Nb_{2/3}O_3$—$PbZrO_3$—$PbTiO_3$ ternary solid solution system composition, with lead germanate particles, to thereby form the piezoelectric/electrostrictive body.

2. The method of manufacturing the piezoelectric/electrostrictive device according to claim 1, wherein an average particle diameter of the lead germanate particles is smaller than that of the first particles.

3. The method of manufacturing the piezoelectric/electrostrictive device according to claim 1, wherein the first particles and the lead germanate particles are mixed and sintered to thereby form the piezoelectric/electrostrictive body having a film shape, and to attach the piezoelectric/electrostrictive body onto a ceramic substrate directly or via the electrode.

4. A method of manufacturing a piezoelectric/electrostrictive device having a piezoelectric/electrostrictive body and an electrode electrically connected to the piezoelectric/electrostrictive body, the method comprising the steps of:

mixing first particles containing, as a major component, a piezoelectric/electrostrictive porcelain composition component including a $PbMg_{1/3}Nb_{2/3}O_3$—$PbZrO_3$—$PbTiO_3$ ternary solid solution system composition and NiO or including a $Pb(Mg, Ni)_{1/3}Nb_{2/3}O_3$—$PbZrO_3$—$PbTiO_3$ ternary solid solution system composition, with lead germanate particles to obtain a mixture;

calcining the mixture at a temperature in a range of 550° C. to 900° C. to obtain a calcined body;

grinding the calcined body to obtain ground particles; and sintering a shaped body of ground particles to form the piezoelectric/electrostrictive body.

5. The method of manufacturing the piezoelectric/electrostrictive device according to claim 4, wherein the ground particles are piezoelectric/electrostrictive porcelain particles containing the piezoelectric/electrostrictive porcelain composition component as a major component, and wherein 30 mass % or more of coated particles, at least a part of which are located on an outer peripheral surface of the piezoelectric/electrostrictive body, are coated with lead germanate.

6. The method of manufacturing the piezoelectric/electrostrictive device according to claim 4, wherein the ground particles are sintered to form the piezoelectric/electrostrictive body having a film shape and to attach the piezoelectric/electrostrictive body onto a substrate made of a ceramic, either directly or via the electrode.

7. The method of manufacturing the piezoelectric/electrostrictive device according to claim 1, wherein the lead germanate particles are at least one kind of lead germanate particles selected from the group consisting of $PbGeO_3$, $Pb_5Ge_3O_{11}$, $Pb_3GeO_5$, an eutectic of $PbGeO_3$ and $Pb_5Ge_3O_{11}$, and an eutectic of $Pb_5Ge_3O_{11}$ and $Pb_3GeO_5$.

8. The method of manufacturing the piezoelectric/electrostrictive device according to claim 4, wherein the lead germanate particles are at least one kind of lead germanate particles selected from the group consisting of $PbGeO_3$, $Pb_5Ge_3O_{11}$, $Pb_3GeO_5$, an eutectic of $PbGeO_3$ and $Pb_5Ge_3O_{11}$, and an eutectic of $Pb_5Ge_3O_{11}$ and $Pb_3GeO_5$.

9. The method of manufacturing the piezoelectric/electrostrictive device according to claim 1, wherein the first particles are thermally treated at a temperature in a range of 1100° C. to 1300° C. before the first and second particles are mixed.

10. The method of manufacturing the piezoelectric/electrostrictive device according to claim 4, wherein the first particles are thermally treated at a temperature in a range of 1100° C. to 1300° C. before the first and second particles are mixed.

* * * * *